US012720932B2

(12) United States Patent
Hussell et al.

(10) Patent No.: US 12,720,932 B2
(45) Date of Patent: Aug. 25, 2026

(54) LIGHT-EMITTING DIODE DEVICES WITH SUPPORT STRUCTURES INCLUDING PATTERNED LIGHT-ALTERING LAYERS

(71) Applicant: CreeLED, Inc., Durham, NC (US)

(72) Inventors: Christopher P. Hussell, Raleigh, NC (US); Boris Dzyubenko, Morrisville, NC (US); Florin A. Tudorica, Chapel Hill, NC (US); Michael Check, Holly Springs, NC (US); Robert David Schmidt, Wake Forest, NC (US); Joseph M. Favale, Jr., Cary, NC (US); Zhenyu Zhong, Tseung Kwan O (HK)

(73) Assignee: CreeLED, Inc., Durham, NC (US)

( * ) Notice: Subject to any disclaimer, the term of this patent is extended or adjusted under 35 U.S.C. 154(b) by 721 days.

(21) Appl. No.: 18/060,309

(22) Filed: Nov. 30, 2022

(65) Prior Publication Data

US 2024/0145652 A1 May 2, 2024

Related U.S. Application Data

(63) Continuation-in-part of application No. 18/051,136, filed on Oct. 31, 2022.

(51) Int. Cl.
*H01L 23/498* (2006.01)
*G11C 5/06* (2006.01)
(Continued)

(52) U.S. Cl.
CPC ...... *H10H 20/856* (2025.01); *H10H 20/8516* (2025.01); *H10H 20/857* (2025.01)

(58) Field of Classification Search
CPC ........ H10H 20/00; H10H 20/80; H10H 20/85; H10H 20/856; H10H 20/882; H10H 29/00;
(Continued)

(56) References Cited

U.S. PATENT DOCUMENTS 7,350,942 B2 4/2008 Chen et al.
8,415,695 B2 4/2013 Lenk
(Continued)

FOREIGN PATENT DOCUMENTS

JP H0720793 A 1/1995
JP 2020167364 A 10/2020
(Continued)

OTHER PUBLICATIONS

Preliminary Examination Report for Taiwanese Patent Application No. 112140885, mailed Sep. 2, 2024, 24 pages.
(Continued)

*Primary Examiner* — Wael M Fahmy
*Assistant Examiner* — Aneesa Riaz Baig
(74) *Attorney, Agent, or Firm* — Withrow & Terranova, P.L.L.C.

(57) ABSTRACT

Light-emitting devices including solid-state light-emitting devices, light-emitting diode (LED) devices, and LED packages with support elements for improved near-field and far-field emissions are disclosed. LED chips may be mounted to support elements in a manner that directs light through the support elements in desired emission directions. Support elements include optical structures that spread and mix light laterally within the support element. Optical structures include various light-altering layers, such as light-diffusing layers or light-reflective layers, that are arranged to effectively increase internal reflections for lateral spreading of light. Patterned arrangements of light-altering layers include portions that mask direct emissions for LED chips, thereby redistributing emissions laterally to increase near-field and/or far-field uniformity across an increased portion of emitting surfaces. Support elements as described may be well suited for low profile LED devices where device heights are less than or equal to device widths.

28 Claims, 13 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10H 20/80*** | (2025.01) |
| ***H10H 20/851*** | (2025.01) |
| ***H10H 20/852*** | (2025.01) |
| ***H10H 20/855*** | (2025.01) |
| ***H10H 20/856*** | (2025.01) |
| ***H10H 20/857*** | (2025.01) |
| ***H10W 90/00*** | (2026.01) |

(58) Field of Classification Search

CPC ........ H10H 29/14; H10H 29/80; H10H 29/85; H10H 20/841; H10H 20/855; H10H 29/855; H10H 29/8552; H10H 29/856; G02F 1/133603–133606

See application file for complete search history.

(56) References Cited

U.S. PATENT DOCUMENTS

| | | | | |
|---|---|---|---|---|
| 10,453,827 | B1 | 10/2019 | Hussell et al. | |
| 2007/0147073 | A1* | 6/2007 | Sakai | G02B 6/0021 362/607 |
| 2010/0110675 | A1* | 5/2010 | Van Herpen | H10H 20/855 349/193 |
| 2012/0134134 | A1 | 5/2012 | Bechtel et al. | |
| 2013/0146936 | A1 | 6/2013 | Tsai et al. | |
| 2014/0071683 | A1 | 3/2014 | Hamada et al. | |
| 2014/0209930 | A1 | 7/2014 | Weng et al. | |
| 2016/0027977 | A1 | 1/2016 | Seo et al. | |
| 2016/0163938 | A1 | 6/2016 | Yu et al. | |
| 2016/0293811 | A1 | 10/2016 | Hussell et al. | |
| 2016/0315070 | A1* | 10/2016 | Schricker | H10H 20/84 |
| 2017/0328525 | A1 | 11/2017 | Herrmann et al. | |
| 2018/0076368 | A1 | 3/2018 | Hussell | |
| 2018/0156421 | A1 | 6/2018 | Li et al. | |
| 2019/0088840 | A1 | 3/2019 | Diana et al. | |
| 2019/0294005 | A1 | 9/2019 | Imada et al. | |
| 2019/0305177 | A1 | 10/2019 | Takamatsu | |
| 2019/0371974 | A1 | 12/2019 | Hussell | |
| 2019/0390839 | A1 | 12/2019 | Sugiyama et al. | |
| 2020/0371398 | A1 | 11/2020 | Imada et al. | |
| 2021/0135057 | A1 | 5/2021 | Ye et al. | |
| 2021/0200028 | A1 | 7/2021 | Zhang et al. | |
| 2022/0077362 | A1* | 3/2022 | Nagel | H10H 20/855 |
| 2022/0155512 | A1 | 5/2022 | Choi et al. | |
| 2022/0171234 | A1* | 6/2022 | Usukura | G02F 1/133536 |
| 2022/0246807 | A1 | 8/2022 | Chae et al. | |
| 2023/0178697 | A1* | 6/2023 | Chu | H10H 20/853 |
| 2023/0231082 | A1 | 7/2023 | Sakai | |
| 2023/0358384 | A1* | 11/2023 | Choi | F21S 4/24 |
| 2023/0378403 | A1* | 11/2023 | Arihara | H01L 25/0753 |
| 2023/0420609 | A1* | 12/2023 | Yu | B60Q 1/0035 |
| 2024/0145439 | A1 | 5/2024 | Dzyubenko et al. | |
| 2024/0421274 | A1 | 12/2024 | Sakai | |

FOREIGN PATENT DOCUMENTS

| | | | |
|---|---|---|---|
| JP | 2022056885 | A | 4/2022 |
| KR | 20210115237 | A | 9/2021 |
| TW | 201431041 | A | 8/2014 |
| TW | 201616687 | A | 5/2016 |

OTHER PUBLICATIONS

Invitation to Pay Additional Fees and Partial Search for International Patent Application No. PCT/US2023/077362, mailed Jan. 31, 2024, 23 pages.

International Search Report and Written Opinion for International Patent Application No. PCT/US2023/077362, mailed Mar. 21, 2024, 27 pages.

Maiorano, et al., "Very Long Operational Lifetime at High Initial Luminance of Deep Red Phosphorescent Organic Light-Emitting Diodes with Double Emission Layers," IEEE Photonics Technology Letters, vol. 20, Issue 24, Dec. 15, 2008, pp. 2105-2107

Office Action for Canadian Patent Application No. 3271798, mailed Apr. 1, 2026, 4 pages.

Search Report for Japanese Patent Application No. 2025-525072, mailed May 29, 2026, 40 pages.

Notice of Reasons for Refusal for Japanese Patent Application No. 2025-525072, mailed Jun. 22, 2026, 6 pages.

* cited by examiner 74
54-2
12-1
12-3
12-2

76
54-2
12-1
12-3
12-2

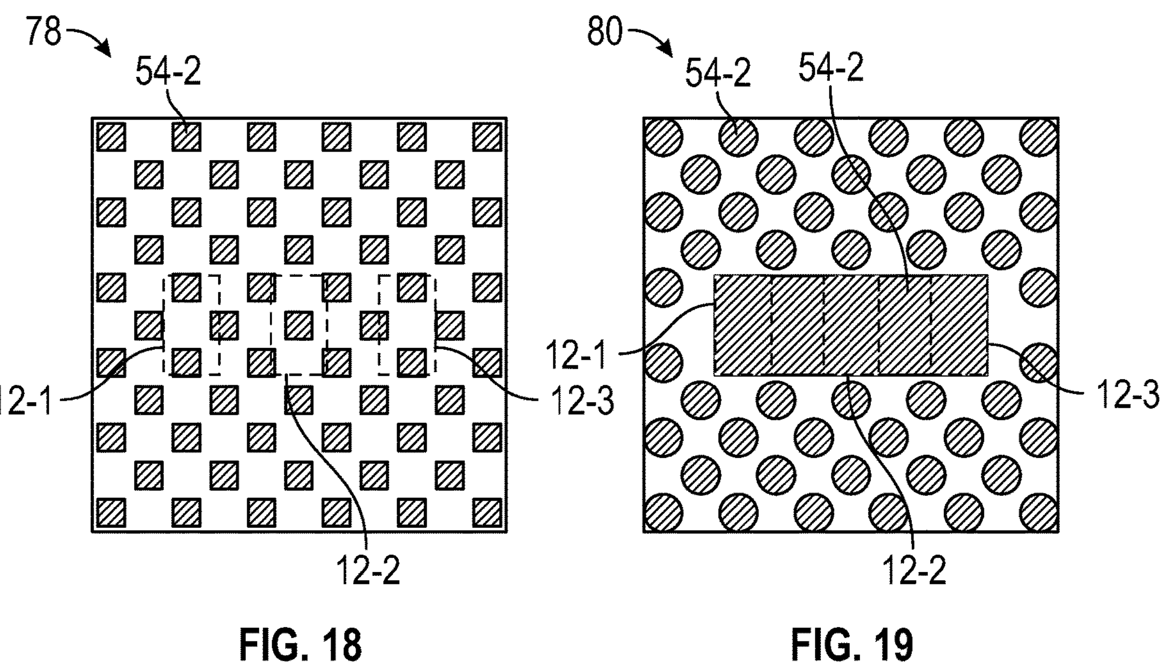
FIG. 18
FIG. 19
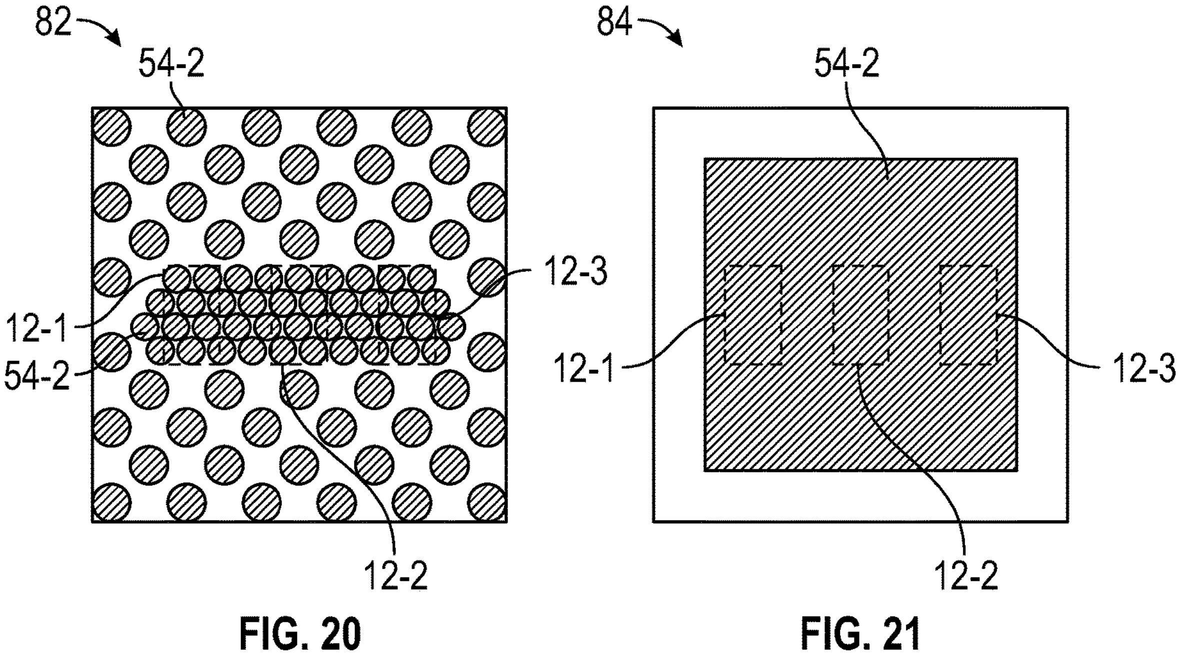
FIG. 20
FIG. 21

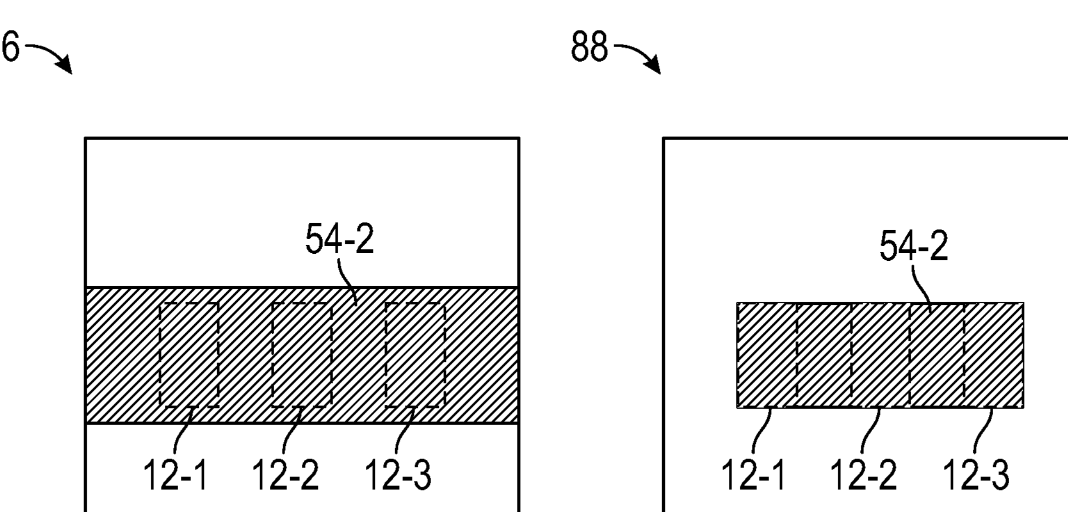
FIG. 22
FIG. 23
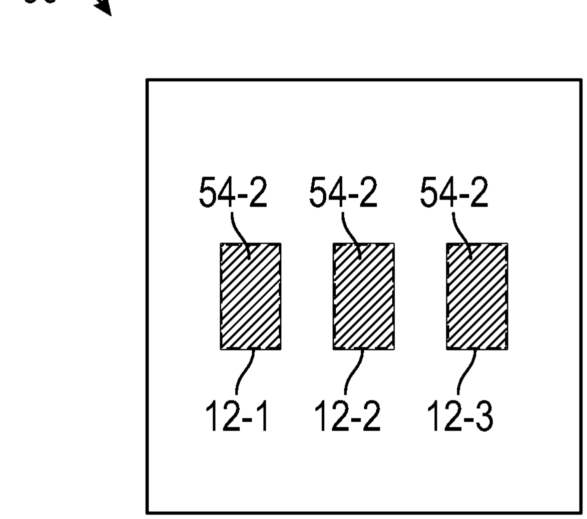
FIG. 24

LIGHT-EMITTING DIODE DEVICES WITH SUPPORT STRUCTURES INCLUDING PATTERNED LIGHT-ALTERING LAYERS

RELATED APPLICATIONS

This application is a continuation-in-part of U.S. patent application Ser. No. 18/051,136, filed Oct. 31, 2022, published as U.S. Publication No. 2024/01454369 A1, the disclosure of which is hereby incorporated herein by reference in its entirety.

FIELD OF THE DISCLOSURE

The present disclosure relates to light-emitting devices including solid-state light-emitting devices, light-emitting diodes, and light-emitting diode packages with support elements including one or more patterned light-altering layers.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications such as video screens and are being routinely utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are emitted in all directions.

LED packages have been developed that provide mechanical support, electrical connections, thermal management, encapsulation, and reflective surfaces for directing light emissions for LED emitters in a desired direction. Light emissions that exit surfaces of LED emitters may interact with various elements or surfaces of corresponding LED packages before escaping. As LED package structures continue to evolve for modern applications, challenges remain in producing high quality light with desired emission characteristics, particularly as overall LED package sizes continue to be miniaturized. The art continues to seek improved LEDs and solid-state lighting devices having desirable illumination characteristics capable of overcoming challenges associated with conventional lighting devices.

SUMMARY

The present disclosure relates to light-emitting devices including solid-state light-emitting devices, light-emitting diode (LED) devices, and LED packages with support elements for improved near-field and far-field emissions. LED chips may be mounted to support elements in a manner that directs light through the support elements in desired emission directions. Support elements include optical structures that spread and mix light laterally within the support element. Optical structures include various light-altering layers, such as light-diffusing layers or light-reflective layers, that are arranged to effectively increase internal reflections for lateral spreading of light. Patterned arrangements of light-altering layers include portions that mask direct emissions for LED chips, thereby redistributing emissions laterally to increase near-field and/or far-field uniformity across an increased portion of emitting surfaces. Support elements as described may be well suited for low profile LED devices where device heights are less than or equal to device widths. Other patterned structures which may not typically be considered as support elements but provide similar improvements in near-field and/or far-field emissions are also described.

In one aspect, an LED device comprises: one or more LED chips; a light-transparent layer on the one or more LED chips; and a light-altering layer that is arranged in a pattern the light-transparent layer such that the light-transparent layer is between the light-altering layer and the one or more LED chips. In certain embodiments, the light-altering layer comprises one or more of a light-diffusing layer, a light-scattering layer, and a light-reflective layer. In certain embodiments, the light-altering layer comprises the light-diffusing layer, and wherein the light-diffusing layer comprises light-diffusing particles dispersed within a light-transparent material or a textured surface. In certain embodiments, the light-altering layer comprises the light-reflecting layer, and wherein the light-reflecting layer has a thickness that is less than or equal to 100 nanometers (nm). The LED package may further comprise a light-absorbing layer on the light-altering layer and on portions of the light-transparent layer that are between portions of the light-altering layer. In certain embodiments, the pattern comprises discontinuous segments of the light-altering layer. In other embodiments, the pattern comprises connected segments of the light-altering layer. The pattern may comprise a segment of the light-altering layer that is registered with the one or more LED chips.

In certain embodiments, the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 750 nm.

The LED package may further comprise a base structure on which the one or more LED chips are mounted, wherein the base structure comprises an insulating submount with electrically conductive traces or a lead frame structure. In certain embodiments, the light-altering layer comprises at least one anodized metal layer. The LED package may further comprise a current spreading layer between the at least one anodized metal layer and the one or more LED chips. In certain embodiments, the at least one anodized metal layer comprises a pigment that is light-absorbing. In certain embodiments, the at least one anodized metal layer comprises localized regions with different thicknesses from one another. In certain embodiments, the pattern is a molded pattern or an embossed pattern. In certain embodiments, the pattern comprises individual features with size in a range from 10 nm to 900 nm.

In another aspect, an LED device comprises: one or more LED chips; a first light-altering layer on the one or more LED chips; a second light-altering layer on the first light-altering layer such that the first light-altering layer is closer to the one or more LED chips than the second light-altering layer; and a light-transparent layer between a first light-altering layer and the second light-altering layer, and at least one of the first light-altering layer and the second light-altering layer is arranged in a pattern on the light-transparent layer. In certain embodiments, the first light-altering layer and the second light-altering layer each comprise a light-diffusing layer or a light-reflective layer.

In certain embodiments, the pattern comprises one or more segments of the second light-altering layer. The first light-altering layer may be arranged in an additional pattern that comprises one or more segments of the first light-altering layer. In certain embodiments, the one or more segments of the first light-altering layer are laterally spaced from the one or more LED chips to form an opening in the first light-altering layer that is registered with the one or more LED chips. In certain embodiments, the one or more segments of the first light-altering layer are arranged between the one or more LED chips and the light-transmissive layer such that the one or more segments of the first light-altering layer are registered with the one or more LED chips. In certain embodiments, the one or more segments of the first light-altering layer are arranged in an inverse pattern to the one or more segments of the second light-altering layer. In certain embodiments, the one or more segments of the first light-altering layer are arranged in a same pattern as the one or more segments of the second light-altering layer. In certain embodiments, the one or more segments of the second light-altering layer form a checkerboard pattern. In certain embodiments, the one or more segments of the second light-altering layer comprise alternating segments that vary in surface area or shape. In certain embodiments, the one or more segments of the second light-altering layer comprise a first segment arranged over the one or more LED chips and a plurality of second segments that are arranged about a periphery of the first segment. In certain embodiments, the one or more segments of the second light-altering layer comprise a plurality of segments that vary in density across the LED device. In certain embodiments, at least one of the first light-altering layer and the second light-altering layer comprises an anodized metal layer.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 18 is a top view of an LED device that is similar to the LED device of FIG. 16 for embodiments where segments of the second light-altering layer are discontinuously formed across the LED device.

FIG. 19 is a top view of an LED device that is similar to the LED device of FIG. 16 for embodiments where shapes and/or sizes of the segments of the second light-altering layer vary across the LED device.

FIG. 20 is a top view of an LED device that is similar to the LED device of FIG. 19 for embodiments where a density of the segments of the second light-altering layer varies across the LED device.

FIG. 21 is a top view of an LED device that is similar to the LED device of FIG. 16 for embodiments where the pattern includes a single large segment of the second light-altering layer that is registered with the LED chips and covers a large portion of topside of the LED device.

FIG. 22 is a top view of an LED device that is similar to the LED device of FIG. 21 where the single segment of the second light-altering layer is provided in a band that traverses between two opposing peripheral edges of the LED device.

FIG. 23 is a top view of an LED device that is similar to the LED device of FIG. 22 where the single segment of the second light-altering layer is provided with a surface area that corresponds with a combined surface area or footprint of the LED chips.

FIG. 24 is a top view of an LED device that is similar to the LED device of FIG. 22 except the second light-altering layer forms a pattern with individual segments, each of which are registered or otherwise matched with footprints of corresponding individual ones of the LED chips.

DETAILED DESCRIPTION

Figure 1:
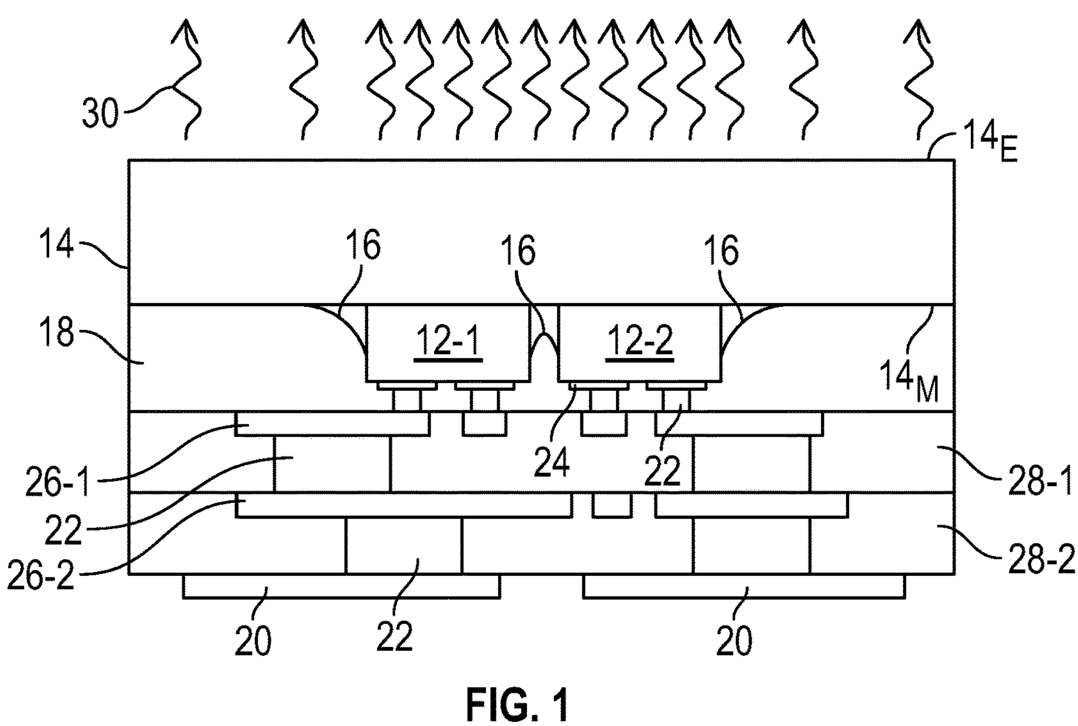
FIG. 1 is a cross-sectional view of a light-emitting diode (LED) device that includes multiple LED chips that are mounted to a mounting face of a support element.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Boundaries between various adjacent layers may be sharp, or more gradual, depending on intended surface finishes and manufacturing process details. Common elements between figures may be shown herein with common element numbers and may not be subsequently re-described.

The present disclosure relates to light-emitting devices including solid-state light-emitting devices, light-emitting diode (LED) devices, and LED packages with support elements for improved near-field and far-field emissions. LED chips may be mounted to support elements in a manner that directs light through the support elements in desired emission directions. Support elements include optical structures that spread and mix light laterally within the support element. Optical structures include various light-altering layers, such as light-diffusing layers or light-reflective layers, that are arranged to effectively increase internal reflections for lateral spreading of light. Patterned arrangements of light-altering layers include portions that mask direct emissions for LED chips, thereby redistributing emissions laterally to increase near-field and/or far-field uniformity across an increased portion of emitting surfaces. Support elements as described may be well suited for low profile LED devices where device heights are less than or equal to device widths. Other patterned structures which may not typically be considered as support elements but provide similar improvements in near-field and/or far-field emissions are also described.

Before delving into specific details of various aspects of the present disclosure, an overview of various elements that may be included in exemplary LED devices of the present disclosure is provided for context. An LED chip typically comprises an active LED structure or region that can have many different semiconductor layers arranged in various ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm, or green light with a peak wavelength range of 500 nm to 570 nm, or red light with a peak wavelength range of 600 nm to 700 nm. In certain embodiments, the active LED structure may be configured to emit light that is outside the visible spectrum, including one or more portions of the ultraviolet (UV) spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. In certain aspects, a single LED package may include multiple LED chips, one or more of which may be configured to provide a different peak wavelength from the other LED chips.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, color rendering index, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits an overall white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, embedded into an optical or support element, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

As used herein, a layer or region of a light-emitting device may be considered to be "transparent" when at least 50% or at least 80% of emitted radiation that impinges on the layer or region emerges through the layer or region. Moreover, as used herein, a layer or region of an LED is considered to be "reflective" or embody a "mirror" or a "reflector" when more than 50% or at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength. In other embodiments, a "light-transmissive" material may be configured with lower values, such as transmitting at least 10%, or at least 25% of light having a desired wavelength, while still being useful for a particular application and suppressing other wavelengths, such as ambient light and/or sunlight. In still further embodiments, the term "light-transmissive" may be used for applications where any useful light, such as emitting wavelengths from an underlying LED, may pass through the material. The terms transparent, reflective, and light-transmissive may be defined relative to certain wavelength ranges, such as those emitted by an LED chip and/or converted by any lumiphoric materials. Specific values listed above are meant to describe average values or properties of an element or layer. It is understood that variations of these properties may be present within or across such elements or layers.

As used herein, the term "opaque" refers to materials, surfaces, particles, among others, that are either not transparent or are non-light transmitting over at least a portion of the visible light spectrum. In certain aspects, the term "opaque" may also apply to the entire visible light spectrum. The term "non-light transmitting" may be considered as transmitting less than 20%, or less than 10% of a received light, or certain wavelengths of received light. A material may further be opaque due to either light absorption or light reflection. Some materials may be opaque at certain wavelengths and transparent at others. As a non-limiting example, a red pigment may act as a color filter by absorbing light wavelengths below approximately 600 nm, where it is opaque, while transmitting light wavelengths above approximately 600 nm, where it is transparent. A layer may include a distribution of opaque materials in an amount such that the layer remains light-transmissive.

The present disclosure can be useful for LED chips having a variety of geometries, such as lateral geometries. A lateral geometry LED chip typically includes both anode and cathode electrical connections on the same side of the LED chip that is opposite a substrate, such as a growth substrate. In certain embodiments, a lateral geometry LED chip may be flip-chip mounted such that the anode and cathode connections are on a face of the active LED structure that is opposite the primary emission face of the LED chip. In this configuration, electrical traces or patterns may be provided on a mounting surface for providing electrical connections to the anode and cathode connections of the LED chip. In a flip-chip configuration, the active LED structure is configured between the substrate of the LED chip and the mounting surface. Accordingly, light emitted from the active LED structure may pass through the substrate in a desired emission direction.

As described herein, the principles of the present disclosure are applicable to various embodiments with a variety of LED chip sized, including larger area chips as well as miniature LED chips and micro-LED chips. As used herein, a large area LED chip may have lateral dimensions up to about 2000 microns (μm), while miniature LED chips may have lateral dimensions around 100 μm, and micro-LED chips may have lateral dimensions below 50 μm. In this manner, LED chips of the present disclosure may have lateral dimensions in a range from 20 μm to 2000 μm, or in a range from 20 μm to 1000 μm, or in a range from 20 μm to 100 μm, or in a range from 100 μm to 2000 μm, depending on the application.

According to aspects of the present disclosure, LED packages may include one or more elements, such as lumiphoric materials, encapsulants, light-altering materials, lenses, superstrates or support elements, adhesive elements, and electrical contacts, among others, that are provided with one or more LED chips. Light-altering materials may be arranged within LED packages to reflect or otherwise redirect light from the one or more LED chips in a desired emission direction or pattern. The term "superstrate" is used herein as a support element in an LED device, in part, to avoid confusion with other traditional substrates or submounts that may conventionally be part of LED devices, such as a growth or carrier substrate of the LED chip and/or a submount of an LED package. The term "superstrate" is not intended to limit the orientation, location, and/or composition of the structure it describes, nor various optical, electrical, thermal, and mechanical properties beyond the description of a support element as described herein. In certain embodiments, the superstrate may be composed of a transparent material, a semi-transparent material, or a light-transmissive material to various wavelengths of light provided by an LED chip and/or lumiphoric material.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), zirconium oxide ($ZrO_2$), aluminum oxide ($Al_2O_3$), metal particles, glass fibers and/or glass particles suspended in a binder, such as silicone or epoxy. In certain aspects, the particles may have an index or refraction that is configured to refract light emissions in a desired direction. In certain aspects, light-reflective particles may also be referred to as light-scattering particles. For light-absorbing materials, the light-altering material may include at least one of carbon, silicon, metal, metal oxides (e.g., iron oxides and the like) and organic particles suspended in a binder, such as silicone or epoxy. Exemplary organic particles may include various pigments, dyes, and/or absorptive additives. Thixotropic materials may include one or more of glass fillers and fumed silica. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray, for absorbing light and increasing contrast. In certain embodiments, the light-altering material includes both light-reflective material and light-absorbing material suspended in a binder. As used herein, a layer or coating of one or more light-altering materials may be referred to as a light-altering coating. In certain embodiments, a light-altering material or coating may be devoid of lumiphoric materials. Light-altering elements may also refer to modified surfaces, such as textures used for diffusion and/or scattering, that do not necessarily require added particles. In still further embodiments, light-altering materials may be provided in the form of coatings that are applied to outer sides or surfaces of light-emitting devices to control light emission.

In certain applications, it is desirable to increase the speed of manufacturing LED devices. One approach to increasing speed of manufacture is to assemble many components on a single support element (or superstrate as described below) and later separate the groups into component arrays. This can be particularly useful when creating multi-color component arrays for use in high-definition (HD) video displays. Multiple arrays can be created as a large sheet and subsequently singulated into individual arrays comprising a plurality of LED devices for each singulated portion. In this manner, a single LED device, after singulation, may be populated with multiple LED chips of different emission colors, such as red, green, and blue, among other. In this regard, such LED devices may be well suited for use as pixels within HD video displays and/or signage applications. In other embodiments, larger arrays of LED chips may be formed together to provide LED components, LED tiles, LED screens, and/or LED displays.

Additionally, the elimination of various elements of a conventional LED device may streamline the manufacturing process, improve light quality, promote device miniaturization, and/or reduce costs. For example, LED devices can be assembled without the use of, or devoid of, a conventional LED package submount (e.g., a ceramic submount with traces, a lead frame structure, a printed circuit board, etc.). This may be accomplished by assembling the LEDs topside down, such that the LED is assembled on a support element, such as a transparent superstrate or a light-transmissive layer, which will become a top-side outer surface in the finished product. The components can then be electrically connected through exposed electrical connection points on the opposite side of the LEDs. The device or apparatus may therefore be devoid of a traditional submount on the side of the LEDs opposite the light-transmitting side, such as, for example, a ceramic, metal, or other type of rigid material substrate upon which LEDs are often attached. An LED device built from the topside down as described herein can be considered a complete LED device, which is devoid of such a rigid submount. That is not to say that such LED devices cannot later be assembled into a larger (e.g., multiple component) device, which can, for example, include a traditional package submount.

While such single LED devices with closely-spaced LED chips of multiple colors may be well suited for use as pixels within HD video displays and/or signage applications, challenges exist in near-field and/or far-field emission patterns from such devices. For example, nonmatching far-field emission patterns provided by different LED chips (e.g., red, blue, and green LED chips) in a single package may contribute to the appearance of a color shift when viewing video displays at various angles. Emission variations can arise both from different emission patterns for the different color chips and from their geometrical placement within LED packages. In another example, near-field emissions are typically concentrated along a center of an LED device from closely-spaced LED chips, which contributes to a more pixelated appearance or reduced fill factor within video screens and displays. In this regard, when multiple LED devices with centrally concentrated near-field emission patterns are assembled together, a so-called "screen door" effect may be visible when darker lines are formed in columns and rows along boundaries of the LED devices within the display.

Support elements according to the present disclosure provide improved far-field emission patterns for increased uniformity at wider viewing angles within a display and/or improved near-field emission uniformity that increases the fill factor within each LED device, thereby reducing the screen door effect in the display. Support elements may include laminate structures with transparent superstrates and/or light-transmissive layers, and any number of materials and optical structures that exhibit light-transmissive and/or light-scattering properties relative to associated LEDs and/or lumiphoric materials. In certain embodiments, support elements may include a laminate structure of various layers or sublayers that are configured to improve near-field and/or far-field emission patterns, particularly for light-emitting devices with multiple chips that emit multiple peak wavelengths of light. The laminate films may generally be light-transmissive to light from corresponding LED chips while also exhibiting one or more of light-reflecting, light-refracting, light-absorbing, light-scattering, and/or light-diffusing properties. In particular embodiments, exemplary support elements may include a light-transparent layer that is sandwiched between two layers with increased light-reflecting, light-refracting, light-absorbing, light-scattering, and/or light-diffusing properties relative to the light-transparent layer. In this regard, the centrally located light-transparent layer may form a mixing chamber for light that may laterally propagate and internally reflect several times along the support element before ultimately escaping the LED device with improved emission uniformity. As used herein, an interior mixing chamber within a support element may also be referred to as an optical cavity.

FIG. 1 is a cross-sectional view of an LED device 10 that includes multiple LED chips 12-1 to 12-2 that are mounted to a mounting face $\mathbf{14}_M$ of a support element 14. For illustrative purposes, only two LED chips 12-1 to 12-2 are illustrated. However, the LED chips 12-1 to 12-2 may include any number of LED chips that are configured to emit the same or different wavelengths of light, depending on the embodiment. By way of example, for display applications where the LED device 10 forms a display pixel, three LED chip may be provided that are configured to emit blue light, green light, and red light. Other color combinations, inclusive of white emissions, may be provided depending on the application. Depending on the application, the LED chips 12-1 to 12-2 may comprise various lateral dimensions, such as in a range from 20 μm to 2000 μm, or in a range from 20 μm to 1000 μm, or in a range from 20 μm to 100 μm, or in a range from 100 μm to 2000 μm. Miniature LED chips (e.g., around 100 μm to 300 μm+/−50 μm) and micro-LED chips (e.g., below 100 μm) may be well suited for pixels in LED displays.

The LED chips 12-1 to 12-2 may be mounted to the support element 14 by way of a die-attach layer 16 that may be continuous or discontinuous across the mounting face $\mathbf{14}_M$ of the support element 14. The die-attach layer 16 may be light-transmissive to wavelengths of light generated by the LED chips 12-1 to 12-2, with exemplary materials including silicone and/or epoxy. After the LED chips 12-1 to 12-2 are adhered to the support element 14 by way of the die-attach layer 16, an encapsulant layer 18 may be applied around a perimeter of and optionally between the LED chips 12-1 to 12-2. The encapsulant layer 18 may be applied by one or more of dispensing, molding, stenciling, screen printing, spinning, spraying, powder-coating, or slit coating. The encapsulant layer 18 may comprise electrically insulating materials, such as one or more of epoxy, epoxy-polyester hybrid, aliphatic urethane, triglycidyl isocyanurate (TGIC) polyester, non-TGIC polyester, silicone, silicone-modified polyester, silicone hybrid, silicone-epoxy hybrid, acrylic, polycarbonate, or any suitable combinations thereof. In certain embodiments, the encapsulant layer 18 may comprise a light-altering material used to control the light output of the LED device 10. For example, the encapsulant layer 18 may comprise light-reflective and/or light-refractive materials to redirect light from the LED chips 12-1 to 12-2, or even light-absorbing materials that provide increased contrast. Certain light-reflective and/or light-refractive materials may exhibit a white appearance while light absorbing materials may exhibit a dark or even black appearance. In certain embodiments, the encapsulant layer 18 may contain structures designed to increase its mechanical strength or other fillers designed to control the coefficient of thermal expansion (CTE).

Electrical connections for the LED chips 12-1 to 12-2 may be provided on sides of the LED chips 12-1 to 12-2 that are opposite the support element 14. Stated differently, the LED chips 12-1 to 12-2 may be arranged between the support element 14 and electrical connections for the LED chips 12-1 to 12-2. In this manner, at least a portion of light from the LED chips 12-1 to 12-2 may pass through the support element 14 without interacting with the electrical connections. The electrical connections may include device contact pads 20 that are electrically connected to one or more of the LED chips 12-1 to 12-2 by way of electrically conductive paths 22 that may include, but are not limited to, electrically conductive pedestals, bump bonds, solder material, wires, traces, and vias comprising metals such as gold (Au) and/or copper (Cu). Different electrically conductive paths 22 may be coupled to corresponding ones of chip contact pads 24. The device contact pads 20 may include a single layer or multiple layers depending on the arrangement and/or manufacturing sequence. A number of electrically conductive traces 26-1, 26-2 and insulating layers 28-1, 28-2 may further be employed to route electrical connections between the device contact pads 20 and the chip contact pads 24. In certain embodiments, the electrically conductive traces 26-1, 26-2 may embody patterned metal traces. For example, the electrically conductive trace 26-1 may be patterned such that segments thereof are electrically coupled with the one or more of the LED chips 12-1 to 12-2 and further extend on portions of the encapsulant layer 18. In certain embodiments, the electrically conductive traces 26-1, 26-2, the insulating layers 28-1, 28-2, and the various electrically conductive paths 22 may form a fanout circuit structure. In still further embodiments, the electrically conductive traces 26-1, 26-2, the insulating layers 28-1, 28-2, and the various electrically conductive paths 22 may be formed at a wafer or panel level before the individual LED device 10 is singulated.

The arrangement of the LED chips 12-1 to 12-2 relative to the support element 14 is provided such that light 30 that escapes the LED device 10 from the LED chips 12-1 to 12-2 may pass through the support element 14 and out of a primary emission face $\mathbf{14}_E$ that is opposite the mounting face $\mathbf{14}_M$. For illustrative purposes, the light 30 is illustrated as a number of arrows that propagate in a direction away from the primary emission face $\mathbf{14}_E$. The illustrated arrows for the light 30 are not meant to be an exact representation of specific light directions as in a ray trace diagram, but rather a conceptual representation of the intensity at the primary emission face $\mathbf{14}_E$. For arrangements where the support element 14 is substantially transparent to the light 30, the light 30 exiting the LED device 10 is more concentrated along central portions of the primary emission face $\mathbf{14}_E$ that are registered with the LED chips 12-1 to 12-2. In this manner, the LED device 10 may exhibit reduced color shift and uniformity for far-field emission patterns as well as increased near-field bright spots that reduce a fill factor in LED displays.

Figure 2:
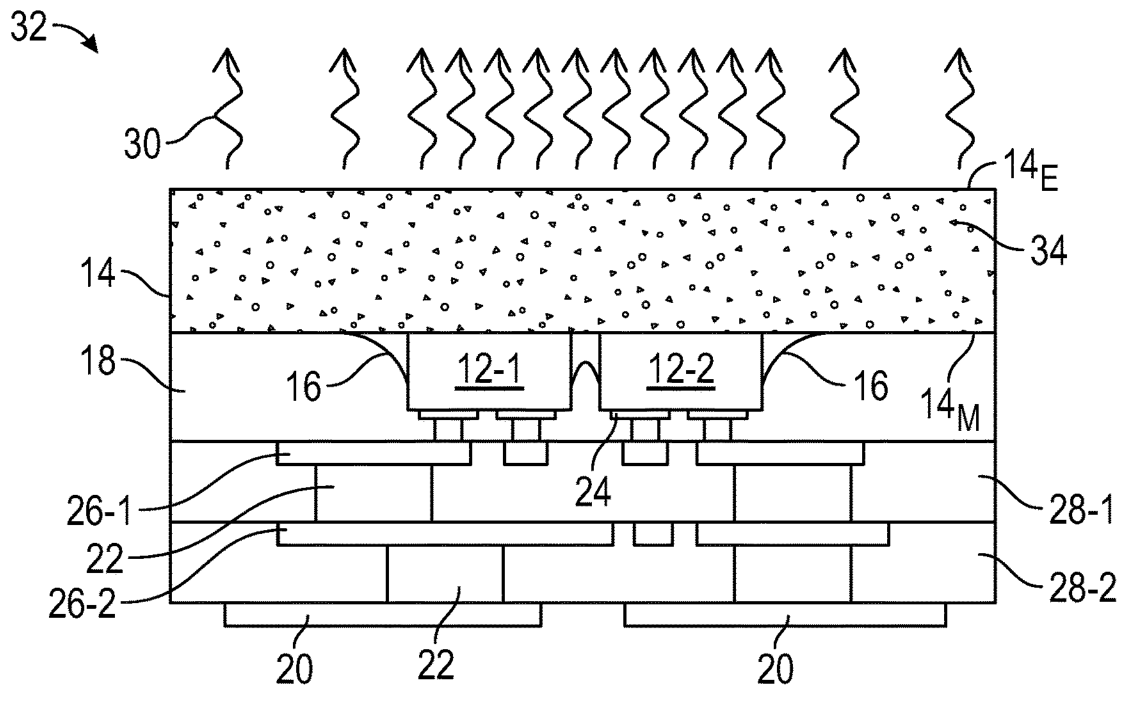
FIG. 2 is a cross-sectional view of an LED device that is similar to the LED device of FIG. 1 except the support element further includes diffuse materials therein.

FIG. 2 is a cross-sectional view of an LED device 32 that is similar to the LED device 10 of FIG. 1 except the support element 14 further includes diffuse materials 34 therein. In this manner, the support element 14 may diffuse and/or scatter light 30 from the LED chips 12-1 to 12-2. However, for certain applications, such as LED display applications, a thickness of the support element 14 is typically thin, small, or reduced to maintain an overall low profile for the LED device 32. In this regard, the presence of diffuse materials 34 alone throughout the support element 14 may not be enough to substantially impact the near-field and far-field emission patterns of the light 30 exiting the LED device 32. While it is common to add diffuse materials 34 over the LED chips 12-1 to 12-2, the desired effect on the light uniformity may be minimal as suggested by the lack of change in arrows for the light 30 between FIG. 2 and FIG. 1. In particular, the effect is minimal when the thickness of the diffuse materials 34 is thin.

Figure 3:
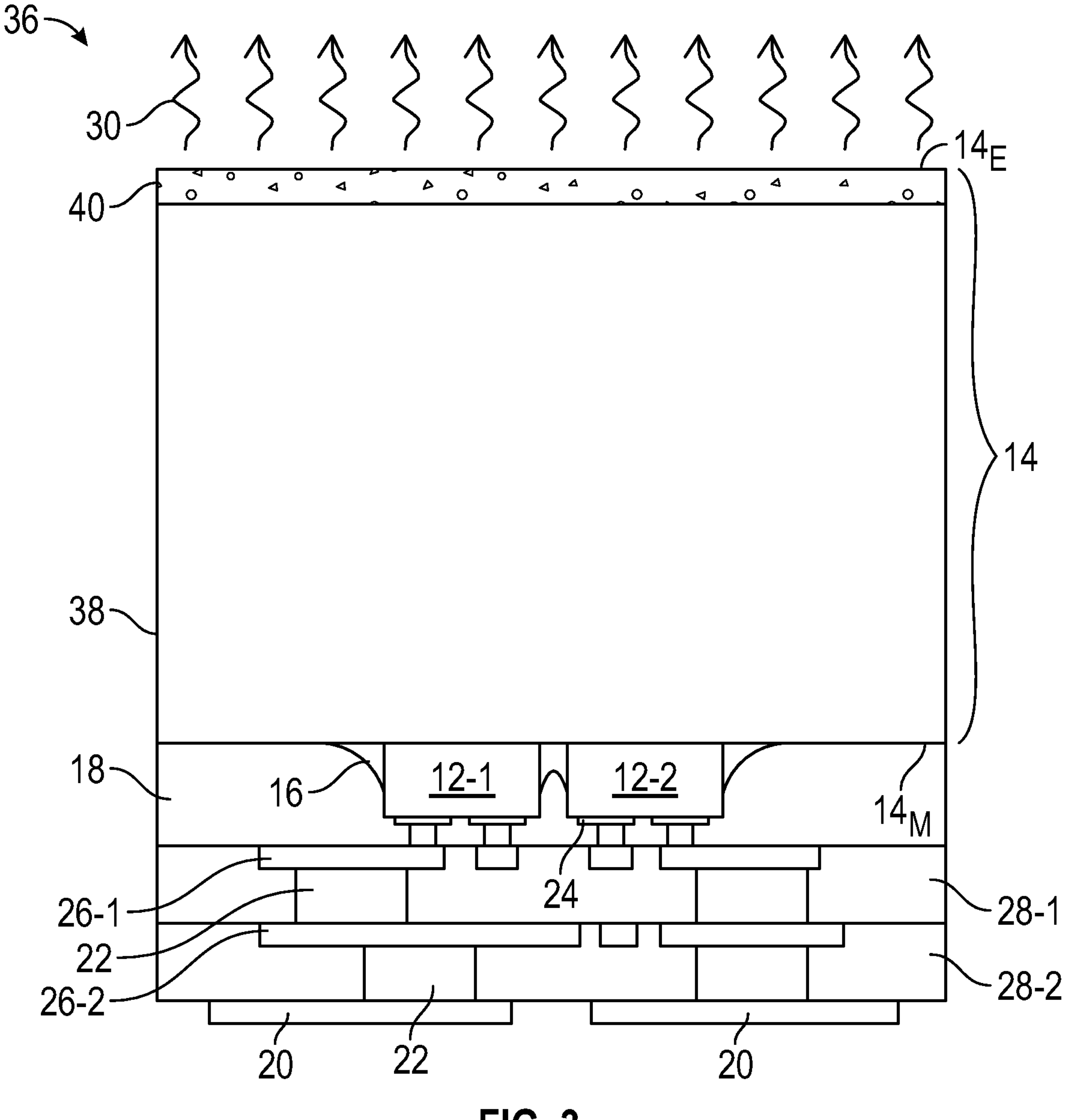
FIG. 3 is a cross-sectional view of an LED device that is similar to the LED device of FIG. 1 except the support element includes a light-transparent layer and a light-diffusing layer.

FIG. 3 is a cross-sectional view of an LED device 36 that is similar to the LED device 10 of FIG. 1 except the support element 14 includes a light-transparent layer 38 and a light-diffusing layer 40. In this manner, the support element 14 of the LED device 36 incorporates features of both the LED device 10 of FIG. 1 and the LED device 32 of FIG. 2. As illustrated, the light-transparent layer 38 may be provided with a thickness that is substantially larger than the light-diffusing layer 40 or, for that matter, any other element of the LED device 36 to ensure a suitable propagation length for mixing of light 30 from the LED chips 12-1 to 12-2. In this regard, the light-diffusing layer 40 is separated from the emission faces of the LED chips 12-1 to 12-2 by a larger distance such that light from the LED chips 12-2 to 12-2 propagating at various emission angles through the light-transparent layer 38 may reach and pass through the light-diffusing layer 40 with increased uniformity. While such an arrangement may advantageously improve near-field and far-field emission patterns, the added thickness of the LED device 36 from the thick light-transparent layer 38 may not be suitable for certain low-profile applications, such as LED displays, or for certain manufacturing processes since singulation for devices with high aspect ratios can be challenging.

Figure 4:
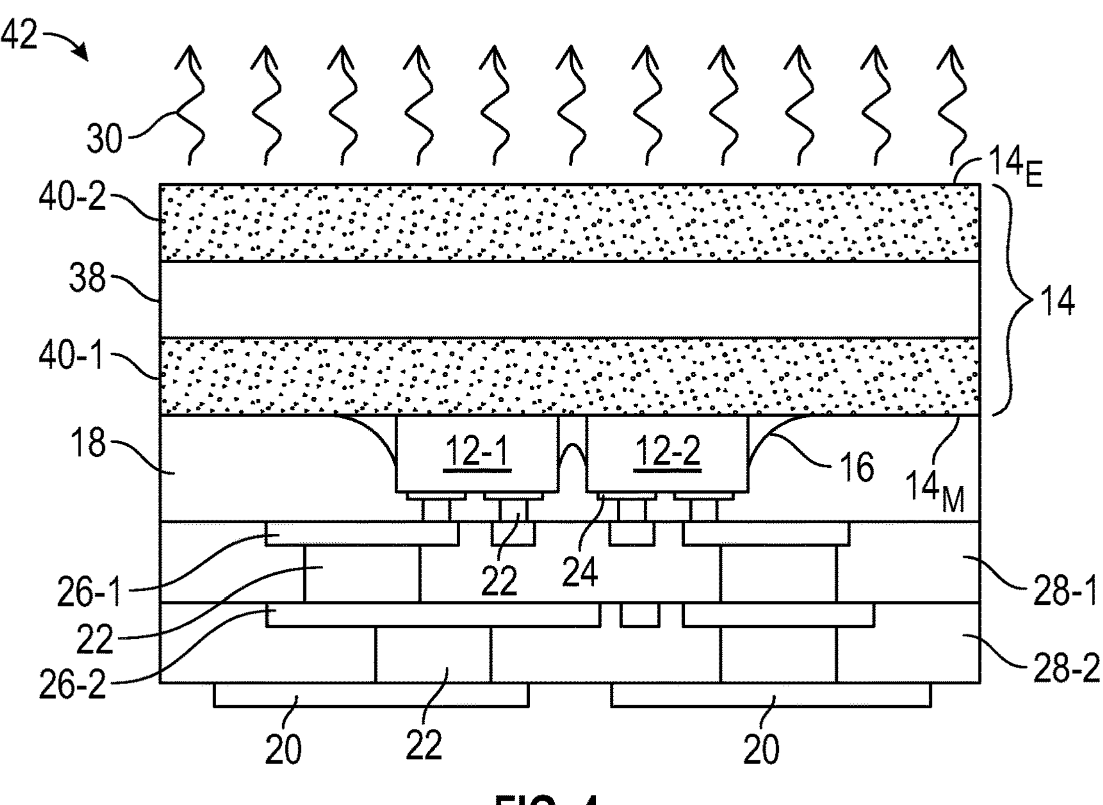
FIG. 4 is a cross-sectional view of an improved LED device relative to the LED device of FIG. 3 where the support element includes a multiple-layer structure that forms an interior mixing chamber for improving near-field and far-field emissions while also maintaining a low profile for the LED device.

FIG. 4 is a cross-sectional view of an improved LED device 42 relative to the LED device 36 of FIG. 3 where the support element 14 includes a multiple-layer structure that forms an interior mixing chamber for improving near-field and far-field emissions while also maintaining a low profile for the LED device 42. In certain embodiments, the support element 14 may include a first light-diffusing layer 40-1 and a second light-diffusing layer 40-2 that are on opposite sides of the light-transparent layer 38. During operation, emissions from the LED chips 12-1 to 12-2 may be initially scattered as they pass through the first light-diffusing layer 40-1 and into the light-transparent layer 38. The scattered emissions within the light-transparent layer 38 may be scattered a second time when interacting with the second light-diffusing layer 40-2. Such a structure provides scattering interfaces on opposing sides of the light-transparent layer 38 at interfaces with the light-diffusing layers 40-1, 40-2, and the light-transparent layer 38 may form an interior mixing chamber that is bounded by the scattering interfaces within the support element 14. In this manner, emissions within the light-transparent layer 38 may scatter multiple times at interfaces with the light-diffusing layers 40-1, 40-2 before exiting the LED device 42, thereby spreading more emissions laterally within the light-transparent layer 38. Accordingly, the light 30 exiting the LED device 42 may exhibit improved near-field and far-field emission patterns.

In certain embodiments, the light-transparent layer 38 may comprise glass, sapphire, epoxy, or other hard materials that are light-transparent to wavelengths of light generated by the LED chips 12-1 to 12-2. The light-diffusing layers 40-1, 40-2 may comprise light-diffusing particles, such as particles of high refractive index, or different refractive index from surrounding media, or a visibly white pigment, that are dispersed within a light-transparent material. As used herein, light-diffusing particles may include any of the light-reflective and/or light-refractive particles described above with regard to the light-altering material. The light diffusing layers 40-1, 40-2 may also comprise a roughened and/or textured surface formed, for example, by etching. In certain embodiments, the light-transparent layer 38 and the light-diffusing layers 40-1, 40-2 may comprise a same material, such as glass, with the light-diffusing layers 40-1, 40-2 further comprising the light-diffusing particles that were added to the material to form the light-diffusing layers 40-1, 40-2. In other embodiments, the light-diffusing layers 40-1, 40-2 may comprise other materials, such as sol-gel, spin-on glass, and/or sintered glass frit with light-diffusing particles dispersed therein.

By forming the interior mixing chamber within the support element 14, improved emissions may be realized while also maintaining a low profile for the LED device 42. As used herein, a low profile may refer to relative dimensions where a height or thickness of the LED device 42 as measured from the device contact pads 20 to the primary emission face $\mathbf{14}_E$ is less than or equal to a lateral width of the LED device 42 as measured from opposing peripheral edges of the support element 14. By way of example, the overall dimensions of the LED device 42 may include the height and width described above that is less than or equal to 1000 microns (μm), or less than or equal to 500 μm, or in a range from 200 μm to 1000 μm, or in a range from 200 μm to 500 μm. To achieve such dimensions, the light-diffusing layers 40-1, 40-2 and the light-transparent layer 38 may each have a thickness in a range from 50 μm to 200 μm, or in a range from 25 μm to 200 μm, or in a range from 20 μm to 200 μm. In still further embodiments, the height and width described above may be in a range from 10 μm to 1000 μm, or in a range from 10 μm to 2000 μm.

Figure 5:
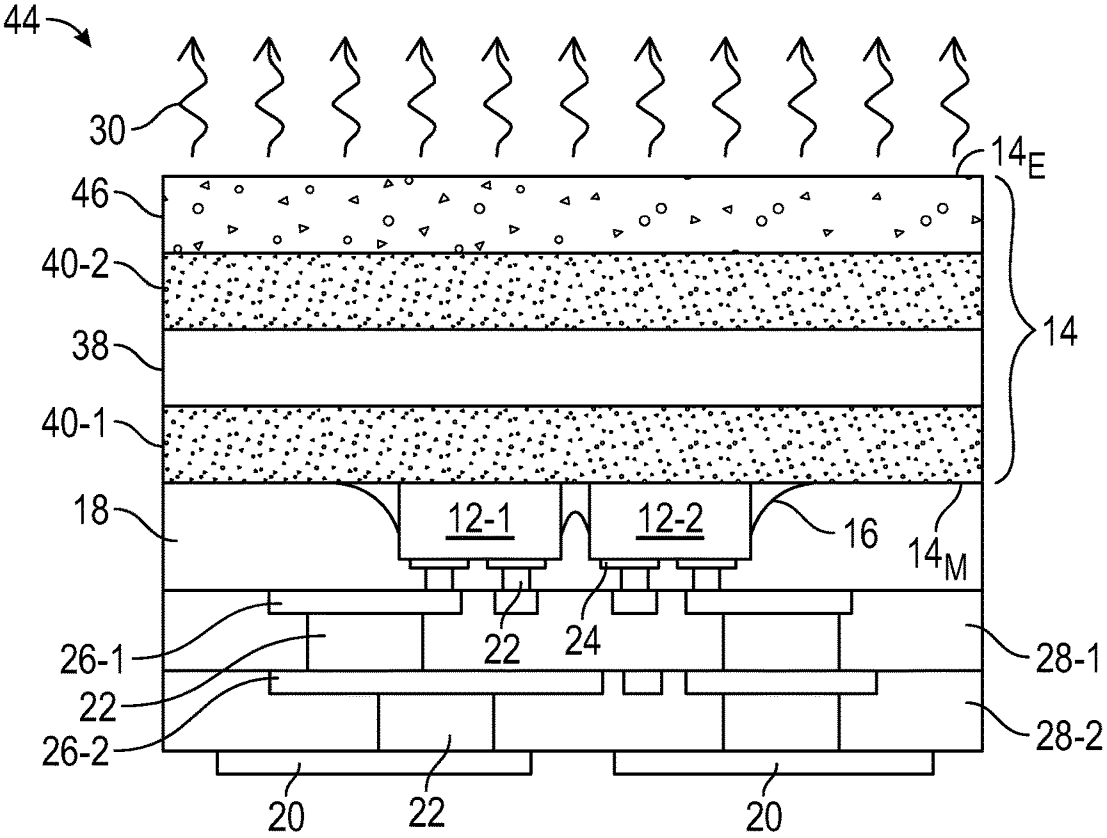
FIG. 5 is a cross-sectional view of an LED device that is similar to the LED device of FIG. 4 for embodiments where the support element further includes a light-absorbing layer.

FIG. 5 is a cross-sectional view of an LED device 44 that is similar to the LED device 42 of FIG. 4 for embodiments where the support element 14 further includes a light-absorbing layer 46. In certain embodiments, the light-absorbing layer 46 may be configured to be light-transmissive to a majority of the light 30 while also providing enough light-absorbing properties for increased contrast. For example, the light-absorbing layer 46 may be configured to reduce the appearance of the underlying white colors of the light-diffusing layers 40-1, 40-2 at wide viewing angles. In certain embodiments, the light-absorbing layer 46 may comprise a same base material as the light-diffusing layers 40-1, 40-2 with light-absorbing particles such as black particles instead of white particles. In still further embodiments, light-absorbing particles may be dispersed in the light-diffusing layer 40-2 and the separate light-absorbing layer 46 may be omitted.

Figure 6:
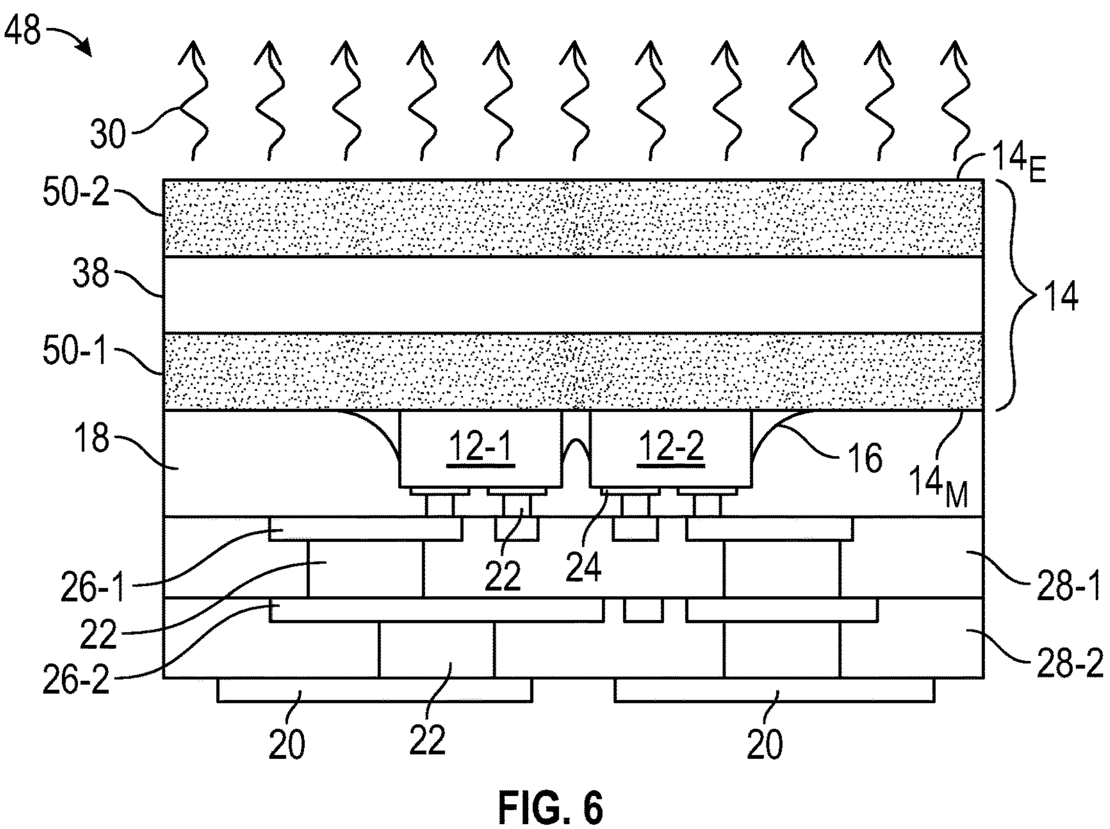
FIG. 6 is a cross-sectional view of an LED device that is similar to the LED device of FIG. 4 except the support element comprises first and second light-reflective layers on opposing sides of the light-transparent layer.

FIG. 6 is a cross-sectional view of an LED device 48 that is similar to the LED device 42 of FIG. 4 except the support element 14 comprises first and second light-reflective layers 50-1, 50-2 on opposing sides of the light-transparent layer 38. In this regard, the interior mixing chamber of the light-transparent layer 38 is bounded by reflective interfaces with the first and second light-reflective layers 50-1, 50-2. The first and second light-reflective layers 50-1, 50-2 may comprise thin layers or coatings of reflective material that are generally light-transmissive to emissions from the LED chips 12-1 to 12-2. In this regard, some light may pass through the first and second light-reflective layers 50-1, 50-2 while other portions of the light may be reflected. Accordingly, the first and second light-reflective layers 50-1, 50-2 may provide a similar function as the light-diffusing layers 40-1, 40-2 of FIG. 4. In certain embodiments, the first and second light-reflective layers 50-1, 50-2 may embody metal layers, each with a thickness that is less than or equal to 50 nm or in a range from 2 nm to 50 nm. In other embodiments, the thicknesses may be greater than 50 nm or less than or equal to 100 nm. In certain embodiments, the first and second light-reflective layers 50-1, 50-2 comprise thin layers of metal or dielectric reflectors that include single dielectric layers or multiple stacks of dielectric layers.

Figure 7:
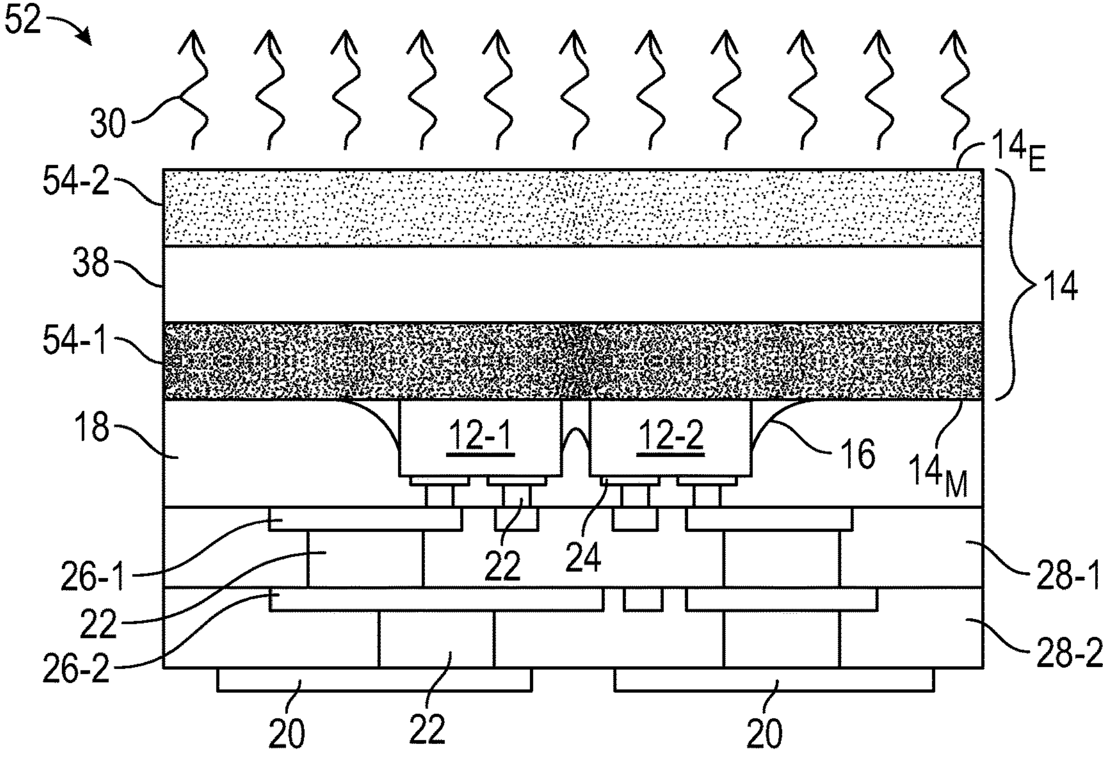
FIG. 7 is a cross-sectional view of an LED device that is similar to the LED device of FIG. 4 except the support element comprises the light-transparent layer between a first light-altering layer and a second light-altering layer that is different than the first light-altering layer.

FIG. 7 is a cross-sectional view of an LED device 52 that is similar to the LED device 42 of FIG. 4 except the support element 14 comprises the light-transparent layer 38 between a first light-altering layer 54-1 and a second light-altering layer 54-2 that is different than the first light-altering layer 54-1. For example, the second light-altering layer 54-2 may be configured to exhibit increased light transmissivity as compared to the first light-altering layer 54-1. In this manner, light 30 propagating and/or scattering within the light-transparent layer 38 may preferentially pass through the second light-altering layer 54-2 and out of the LED device 52 in a desired emission direction. Accordingly, reduced amounts of light 30 may pass back through the first light-altering layer 54-1 and toward the LED chips 12-1, 12-2, where such emissions may be susceptible to absorption. In other embodiments, the order may be reversed such that the first light-altering layer 54-1 is configured to exhibit increased light transmissivity as compared to the second light-altering layer 54-2 to promote increased light spreading and/or recycling within the light-transparent layer 38 before exiting the LED device 52.

In one embodiment for FIG. 7, the first light-altering layer 54-1 and the second light-altering layer 54-2 may both comprise light-reflective layers 50-1, 50-2 as described above for FIG. 6, except the first light-altering layer 54-1 may be configured to be more reflective to peak wavelengths of light from the LED chips 12-1 to 12-2 than the second light-altering layer 54-2. For example, the first light-altering layer 54-1 may comprise a different reflective material than the second light-altering layer 54-2. In another example, both the first and second light-altering layers 54-1, 54-2 comprise the same material, and the second light-altering layer 54-2 may be formed with a reduced thickness compared to the first light-altering layer 54-1 to provide the increased light transmissivity.

In another embodiment for FIG. 7, the first light-altering layer 54-1 and the second light-altering layer 54-2 may both comprise light-diffusing layers 40-1, 40-2 as described above for FIG. 4, except the first light-altering layer 54-1 may be configured to diffuse more light from the LED chips 12-1 to 12-2 than the second light-altering layer 54-2. For example, the first light-altering layer 54-1 may be loaded with a higher density of light-diffusing particles than the second light-altering layer 54-2, and/or the second light-altering layer 54-2 may be formed with a reduced thickness compared to the first light-altering layer 54-1 to provide the increased light transmissivity.

In yet another embodiment for FIG. 7, the first light-altering layer 54-1 may comprise the light-reflective layer 50-1 as described above for FIG. 6 and the second light-altering layer 54-2 may comprise the light-diffusing layer 40-2 as described above for FIG. 4. In this manner, the first light-altering layer 54-1 may embody a thin layer of reflective material that allows sufficient light to pass from the LED chips 12-1 to 12-2 to the light-transparent layer 38, while also restricting increased amounts of light within the light-transparent layer 38 from propagating back toward the LED chips 12-1 to 12-2. The second light-altering layer 54-2 may serve to further diffuse light as it exits the primary emission face $\mathbf{14}_E$ of the support element 14.

Figure 8:
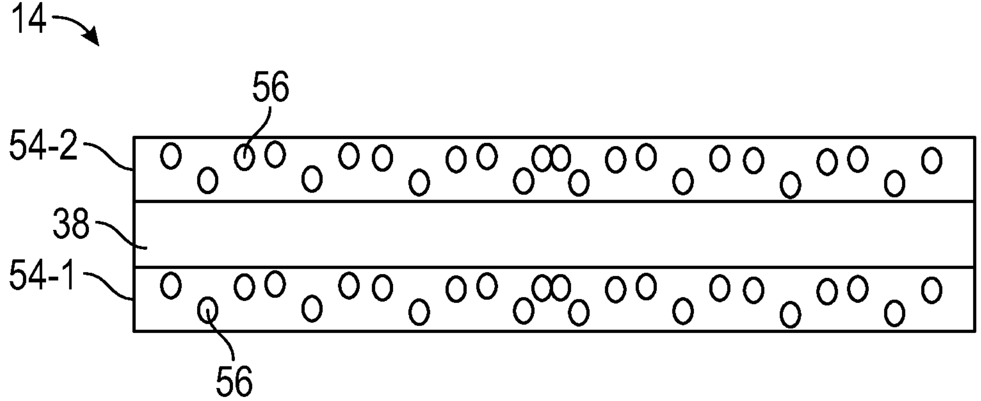
FIG. 8 is a cross-sectional view of an alternative configuration of the support element of FIG. 7 for embodiments where the first and second light-altering layers are loaded with air voids or air bubbles to promote increased light scattering.

FIG. 8 is a cross-sectional view of an alternative configuration of the support element 14 of FIG. 7 for embodiments where the first and second light-altering layers 54-1, 54-2 are loaded with air voids 56, or air pockets and/or air bubbles, to promote increased light scattering. In this regard, the bulk of the first and second light-altering layers 54-1, 54-2 may comprise light-transparent materials, such as glass or ceramic materials, and the air voids 56 may be dispersed therein to provide light-diffusing characteristics. In certain embodiments, each of the first and second light-altering layers 54-1, 54-2 and the light-transparent layer 38 may comprise a same material, such as ceramic materials, glass, spin on glass, or sintered glass frit. In other embodiments, one or more of the first and second light-altering layers 54-1, 54-2 and the light-transparent layer 38 may comprise different materials from one another. For example, the light-transparent layer 38 may comprise sapphire and the first and second light-altering layers 54-1, 54-2 may comprise another ceramic, such as aluminum oxide with some porosity. For glass frit embodiments, a laminate structure of the first and second light-altering layers 54-1, 54-2 and the light-transparent layer 38 may be sintered together, and a size and/or density of the air voids 56 may be controlled by selection of frit particle size and/or a pressure of the laminate structure.

Figure 9:
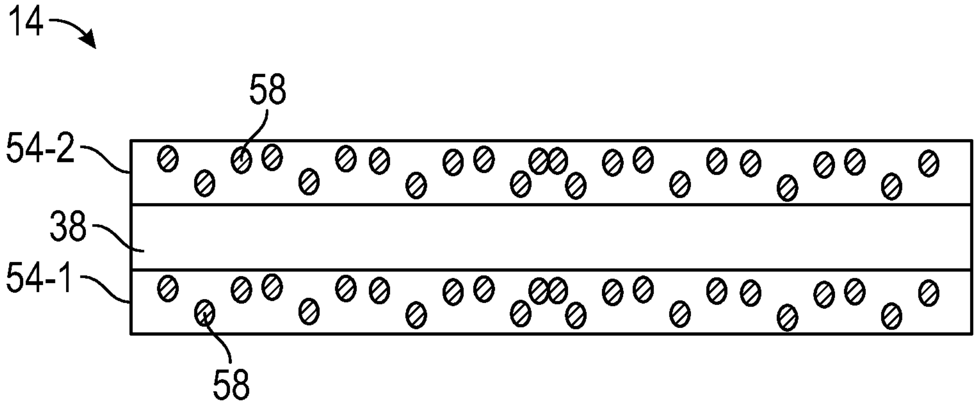
FIG. 9 is a cross-sectional view of an alternative configuration of the support element of FIG. 7 for embodiments where the first and second light-altering layers are loaded with oxide particles with shapes and/or particle size distributions or media with differing refractive index values to promote increased light scattering.

FIG. 9 is a cross-sectional view of an alternative configuration of the support element 14 of FIG. 7 for embodiments where the first and second light-altering layers 54-1, 54-2 are loaded with oxide particles 58 with shapes and/or particle size distributions or media with differing refractive index values to promote increased light scattering. In this regard, the bulk of the first and second light-altering layers 54-1, 54-2 may comprise light-transparent materials, such as glass or ceramic materials, and the oxide particles 58 may be dispersed therein to provide light-diffusing characteristics. As with the configuration of FIG. 8, each of the first and second light-altering layers 54-1, 54-2 and the light-transparent layer 38 may comprise a same material, such as ceramic materials, glass, spin on glass, or sintered glass frit. In other embodiments, one or more of the first and second light-altering layers 54-1, 54-2 and the light-transparent layer 38 may comprise different materials from one another. For example, the light-transparent layer 38 may comprise sapphire and the first and second light-altering layers 54-1, 54-2 may comprise another ceramic, such as aluminum oxide with the oxide particles 58. For glass frit embodiments, a laminate structure of the first and second light-altering layers 54-1, 54-2 and the light-transparent layer 38 may be sintered together. The size and/or density of the oxide particles 58 may be controlled by selection of frit particle size or distribution and/or controlling a sintering time such that some glass may precipitate out the oxide particles 58 within the first and second light-altering layers 54-1, 54-2. In another embodiment, a size and/or density of the oxide particles 58 may be controlled by the addition of oxide precursor materials that are loaded within the first and second light-altering layers 54-1, 54-2 before sintering. In still further embodiments, the oxide particles 58 as illustrated in FIG. 9 may represent any media that provides differing index of refraction values from the light-transparent layer 38 and the bulk of the first and second light-altering layers 54-1, 54-2.

In certain embodiments, the support element 14 as described above for any of FIGS. 4 to 9 may be formed by a laminate structure that is fired or sintered together. The laminate structure may include light-transparent materials, such as ceramics including aluminum oxide, sapphire, glass, spin on glass, or sintered glass frit in the light-transparent layers and/or light-altering layers described above. Light-diffusing particles, air voids, oxide particles, and reflective layers may be employed as the light-altering layers to define boundaries of interior light mixing chambers that circulate light therebetween. As such, light within the mixing chambers may spread laterally before exiting, thereby providing improved near-field and far-field emission patterns. In certain embodiments, such benefits may be realized for low profile dimensions where overall device heights are less than or equal to overall device widths. Any of the support elements 14 and related LED devices described above may advantageously be formed at a wafer level before individual device singulation. Additionally, any of the LED devices described above for FIGS. 4 to 9 may be well suited for providing improved near-field and far-field emissions when the LED devices include multiple LED chips of multiple colors. For example, a first LED chip may be configured to provide a first peak wavelength in a range from 430 nm to 480 nm, a second LED chip may be configured to provide a second peak wavelength in a range from 500 nm to 570 nm, and a third LED chip may be configured to provide a third peak wavelength in a range from 600 nm to 700 nm or in a range from 600 nm to 750 nm. Other embodiments may include one or more LED chips that provide UV wavelengths or wavelength ranges as described above.

Additionally, the support element 14 is generally illustrated above as a three-layer structure; however, it should be recognized that the support element 14 may include any number of layers while falling under the scope of the present disclosure. For example, individual ones of the light-diffusing layers 40-1, 40-2, the light-reflective layers 50-1, 50-2, and the light-altering layers 54-1, 54-2 may embody multiple-layered structures. The principles disclosed herein are related to increasing lateral spreading of light by recycling light through the support element 14 with increased reflection and/or diffusion (e.g., specular or diffuse reflection) from top and bottom areas or layers. These areas or layers could be anything from very thin (e.g., metal mirror) to something thicker. These areas or layers can be uniform within themselves as illustrated herein, have graded profiles, or be composed of multiple semi-uniform layers. In still further embodiments, the individual layers of the support elements 14 as described above for any of FIGS. 4 to 9 may be repeated to form multiple mixing chambers in a stacked fashion within a single support element 14.

As described above, LED devices of the present disclosure are well suited for use as pixels in LED display applications. In such applications, it is desirable to further improve the fill factor of light within each LED device to reduce pixelated appearances within displays, particularly when viewed at close distance. In certain LED devices, an area of the LED chips within the LED device is typically much smaller than the overall device footprint, thereby providing higher intensity emissions at a center of the LED device and sometimes contributing to a screen door effect when arranged as pixels in straight lines and columns within a display. According to further embodiments of the present disclosure, additional configurations of optical structures including light-transparent layers and one or more patterned light-altering layers are disclosed that further promote lateral spreading of light within each LED device. The one or more patterned light-altering layers may be provided to redistribute higher intensities of light laterally within LED devices, thereby reducing or even masking light output associated with bright spots that would otherwise be present directly over the LED chips.

Figures 10, 11A:
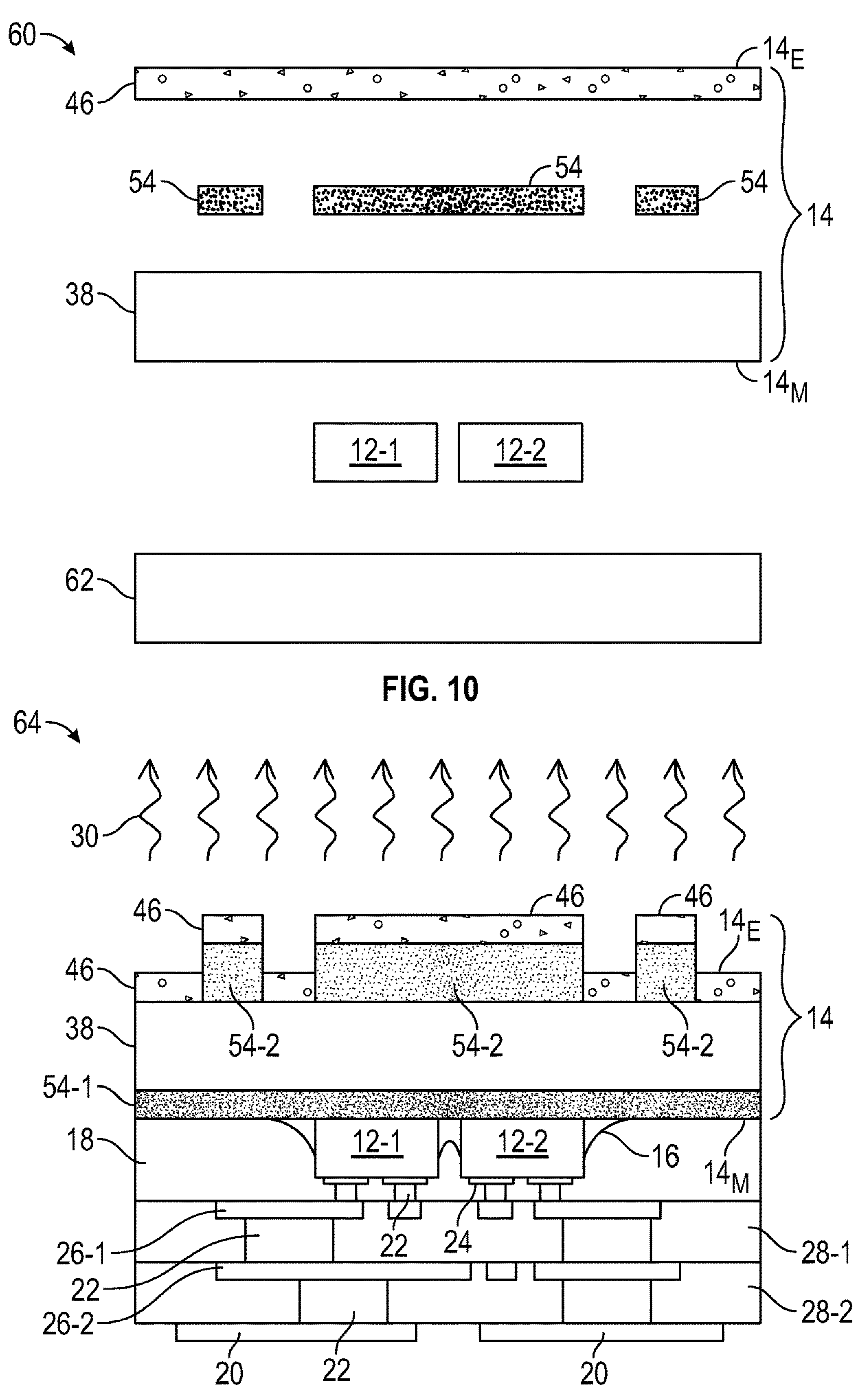
FIG. 10 is an exploded view of a general LED device that is similar to the LED device of FIG. 4 and where at least one light-altering layer is patterned to tailor emission patterns from the LED device.
FIG. 11A is a cross-sectional view of an LED device that is similar to the LED device of FIG. 10 and includes first and second light-altering layers on opposing sides of the light-transparent layer.

FIG. 10 is an exploded view of a general LED device 60 that is similar to the LED device 42 of FIG. 4 and where at least one light-altering layer 54 is patterned to tailor emission patterns from the LED device 60. The LED device 60 may include one or more of the LED chips 12-1 to 12-2 as illustrated. The light-altering layer 54 may embody a patterned or segmented layer that is similar to any of the light-diffusing layers 40-1, 40-2 as described above for FIG. 4 and/or the light-reflective layers 50-1, 50-2 as described above for FIG. 6. As with previous embodiment, the LED device 60 may include any number of LED chips, including embodiments that have a red LED chip, a blue LED chip, and a green LED chip. In FIG. 10, a base structure 62 is generally indicated below the LED chips 12-1 to 12-2. When present, the base structure 62 may provide primary support for the LED chips 12-1 to 12-2 and other elements of the LED device 60. In this regard, the support element 14 may represent additional layers that are formed on and/or supported by the base structure 62. The base structure 62 may include any of the electrically conductive traces 26-1, 26-2, the insulating layers 28-1, 28-2, the device contact pads 20, the chip contact pads 24, and the electrically conductive paths 22 as described and illustrated in FIGS. 1 to 7. The base structure 62 may also embody one of many known base structures in the art such as a lead frame-based plastic leaded chip carrier (PLCC). In such cases, other elements not shown in FIG. 10 are assumed, such as reflectors along sides of the LED device 60 that redirect light to areas such as the light-transparent layer 38. In the case of a PLCC device, such reflectors generally constitute a white plastic housing containing portions of the leads.

As illustrated in FIG. 10, the light-altering layer 54 is patterned such that it does not entirely cover the light-transparent layer 38. The patterning may include a number of discontinuous segments of the light-altering layer 54. Alternatively, the patterning may include continuous or connected segments of the light-altering layer 54 with a distribution of various openings that break up the surface area of the light-altering layer 54. The patterning may be performed by a selective deposition or selective removal process. In other embodiments, the patterning may be provided by molding or even an embossing process where shapes are formed in a host material and the shapes are filled with light-altering materials. Individual features sizes of the light-altering layer 54 within the pattern may in a nanoscale, such as in a range from 10 nm to 900 nm. The pattern of the light-altering layer 54 allows at least some light from the LED chips 12-1, 12-2 to be redirected by the light-altering layer 54 in certain areas. In other areas that do not include portions of the light-altering layer 54, the light may pass more freely. In certain embodiments, such patterning of the light-altering layer 54 may be arranged to avoid the appearance of centrally located bright spots for the LED device 60, thereby increasing a fill factor for light. For example, a portion of the light-altering layer 54 may be vertically registered with the LED chips 12-1 to 12-2 to reduce and/or redirect light from the LED chips 12-1 to 12-2 away from a center of the LED device 60. As used herein, vertically registered may be defined as an arrangement where a vertical line would intersect the two elements. For example, a first vertical line through the LED chip 12-1 and a second vertical line through the LED chip 12-2 would both intersect portions of the light-altering layer 54. In certain embodiments, other portions or segments of the light-altering layer 54 may be arranged in other areas that are not directly above the LED chips 12-1 to 12-2 to further tailor emission patterns. In certain embodiments, the light-absorbing layer 46 may be provided on the light-altering layer 54 and/or the light-transparent layer 38.

FIG. 11A is a cross-sectional view of an LED device 64 that is similar to the LED device 60 of FIG. 10 and includes first and second light-altering layers 54-1, 54-2 on opposing sides of the light-transparent layer 38. In FIG. 11A, the second light-altering layer 54-2 that is above the light-transparent layer 38 relative to the LED chips 12-1, 12-2 is patterned while the first light-altering layer 54-1 continuously covers the light-transparent layer 38. In this manner, once light 30 is propagating within the light-transparent layer 38, such light 30 may more readily pass through the patterned second light-altering layer 54-2 in a desired emission distribution. However, it is understood the order could be reversed such that the first light-altering layer 54-1 is patterned to provide different light emission patterns. By virtue of the patterning, localized mixing chambers that promote localized light recirculation are formed throughout portions of the support element 14 that are bounded by the first and second light-altering layers 54-1, 54-2.

As illustrated in FIG. 11A, a central segment of the second light-altering layer 54-2 is vertically registered over the LED chips 12-1, 12-2. In certain embodiments, the segment of the second light-altering layer 54-2 includes a large enough area to laterally extend past peripheral edges of the LED chips 12-1, 12-2. The second light-altering layer 54-2 may further include segments that are arranged closer to perimeter portions of the LED device 64 to further tailor emission patterns. The light-absorbing layer 46, when present may be arranged on the segments of the second light-altering layer 54-2 as well as optionally on portions of the light-transparent layer 38 that are between the segments or portions of the second light-altering layer 54-2. In certain embodiments, the pattern of the light-absorbing layer 46 may be the same as the second light-altering layer 54-2, while in other embodiments, the light-absorbing layer 46 may have an inverse pattern to the second light-altering layer 54-2.

Figure 11B:
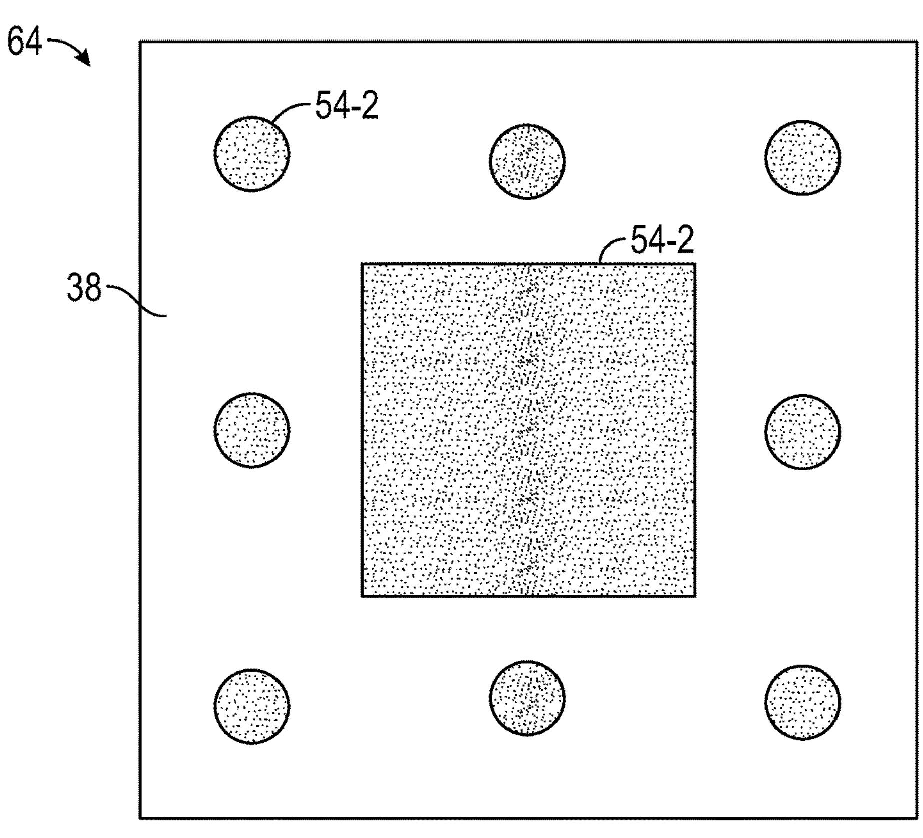
FIG. 11B is an exemplary top view of the LED device of FIG. 11A.

FIG. 11B is an exemplary top view of the LED device 64 of FIG. 11A. As illustrated, the central segment of the second light-altering layer 54-2 is centrally located while a number of smaller segments of the second light-altering layer 54-2 are radially arranged in an inset manner from peripheral edges of the LED device 64. In this regard, portions of light from the LED chips 12-1, 12-2 of FIG. 11A may be laterally redirected away from the center of the LED device 64 toward the peripheral edges and such light may further be laterally redirected in various localized positions near the peripheral edges. In the context of the LED device 64 forming a pixel in an LED display, the arrangement of the second light-altering layer 54-2 may reduce and/or inhibit direct viewing of the underlying LED chips 12-1 to 12-2 of FIG. 11A.

Figure 12:
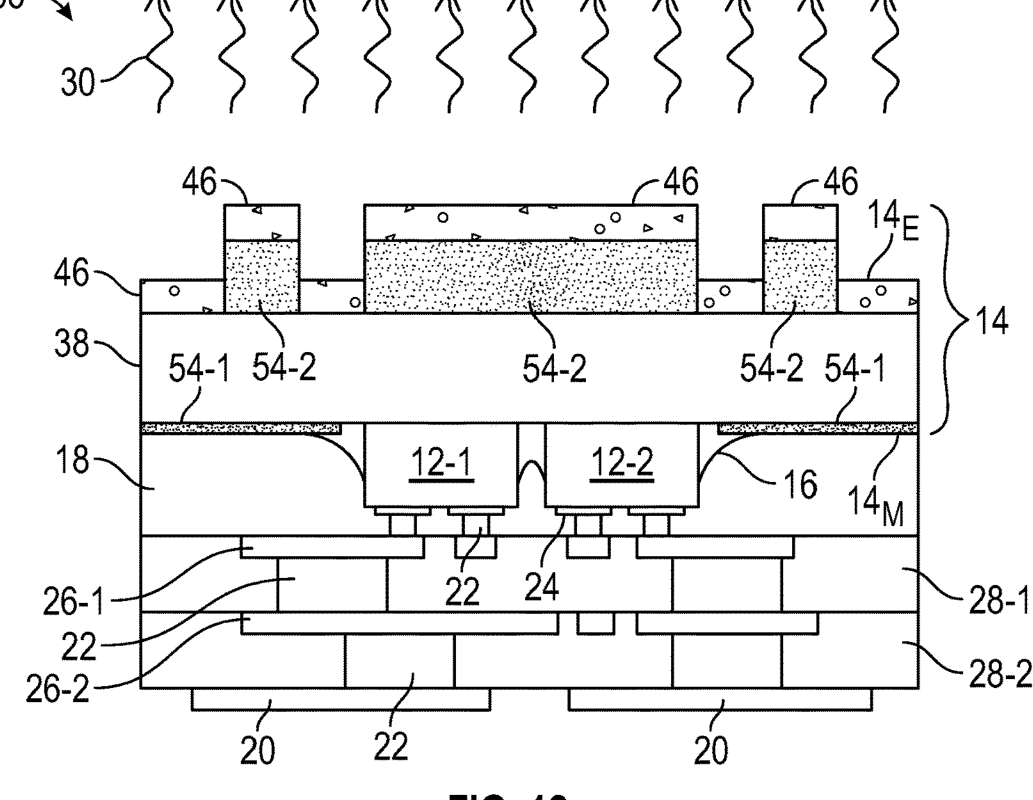
FIG. 12 is a cross-sectional view of an LED device that is similar to the LED device of FIGS. 11A and 11B and where the first light-altering layer is also patterned.

FIG. 12 is a cross-sectional view of an LED device 66 that is similar to the LED device 64 of FIGS. 11A and 11B and where the first light-altering layer 54-1 is also patterned. As such, both of the first and second light-altering layers 54-1, 54-2 may be patterned on opposing sides of the light-transparent layer 38. In certain embodiments, the pattern of the second light-altering layer 54-2 is similar to FIG. 11A while an additional pattern of the first light-altering layer 54-1 is provided. For example, the first light-altering layer 54-1 may be formed in segments that are laterally spaced from the LED chips 12-1, 12-2, thereby forming an opening in the first light-altering layer 54-1 that is vertically registered with the LED chips 12-1, 12-2 to allow increased amounts of light to enter the light-transparent layer 38. Such an arrangement may be particularly suitable for embodiments where the first light-altering layer 54-1 comprises a layer with increased reflectivity as compared with the second light-altering layer 54-2. In this manner, light may freely pass from the LED chips 12-1, 12-2 into the light-transparent layer 38 while laterally propagating light within the light-transparent layer 38 may be reflected toward a desired emission direction. As described above, the pattern of the light-absorbing layer 46 may be the same as or inverse to the second light-altering layer 54-2.

Figure 13:
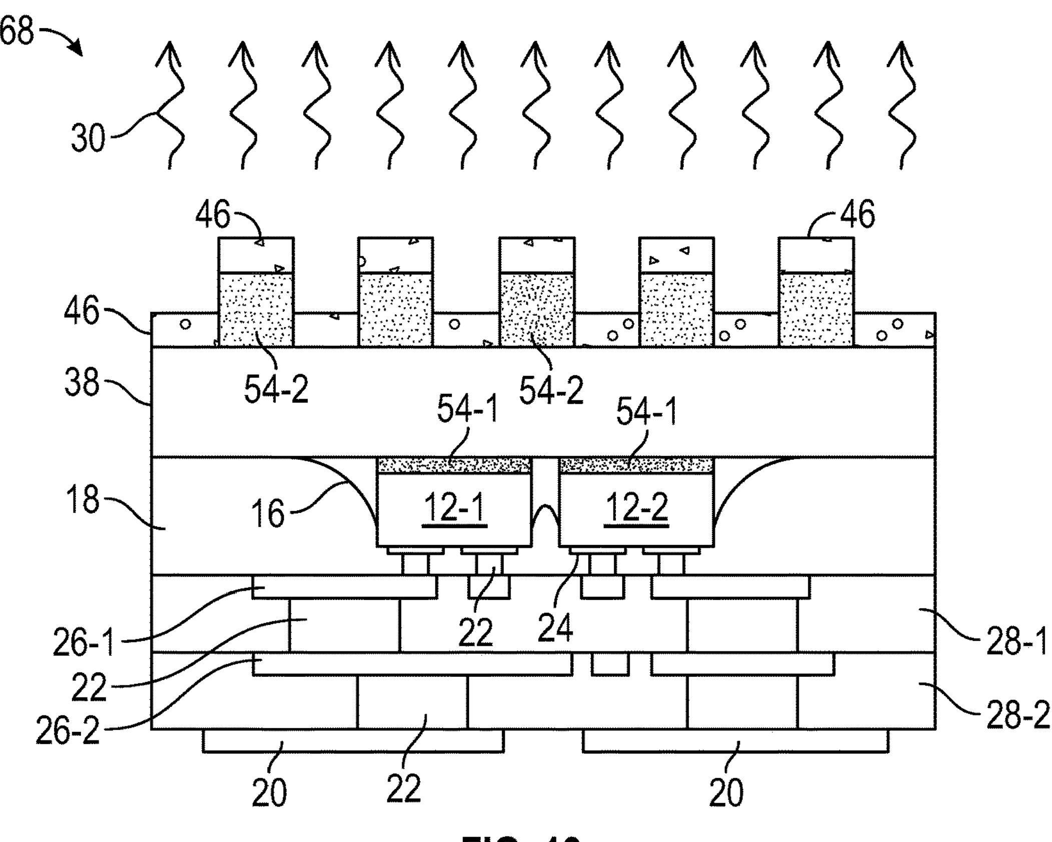
FIG. 13 is a cross-sectional view of an LED device that is similar to the LED device of FIG. 12 and where the first light-altering layer is patterned with segments that are registered with the LED chips to block direct LED chip emissions.

FIG. 13 is a cross-sectional view of an LED device 68 that is similar to the LED device 66 of FIG. 12 and where the first light-altering layer 54-1 is patterned with segments that are registered with the LED chips 12-1, 12-2 to block direct emissions from the LED chips 12-1, 12-2. As illustrated, the segments of the first light-altering layer 54-1 may be provided between top surfaces of the LED chips 12-1, 12-2 and the light-transparent layer 38, thereby redirecting emissions from the LED chips 12-1, 12-2 laterally before entering the light-transparent layer 38. In this manner, bright spots associated with the location of the LED chips 12-1, 12-2 in the light 30 exiting the LED device 68 may be reduced. As further illustrated in FIG. 13, the segments of the second light-altering layer 54-2 may be distributed across the light-transparent layer 38 without having to entirely cover the LED chips 12-1, 12-2. For such an arrangement, one or more of the die attach layer 16 and the encapsulant 18 may serve as lateral spreading layers that are at least partially light-transmissive and propagate the light away from the LED chips 12-1 to 12-2 before passing into the light-transparent layer 38. If the die attach layer 16 covers enough surface area of the light-transparent layer 38 adjacent the LED chips 12-1 to 12-2, the encapsulant 18 may be configured with increased reflectivity, such as being inclusive of white reflective particles. As described above, the pattern of the light-absorbing layer 46 may be the same as or inverse to the second light-altering layer 54-2.

Figure 14:
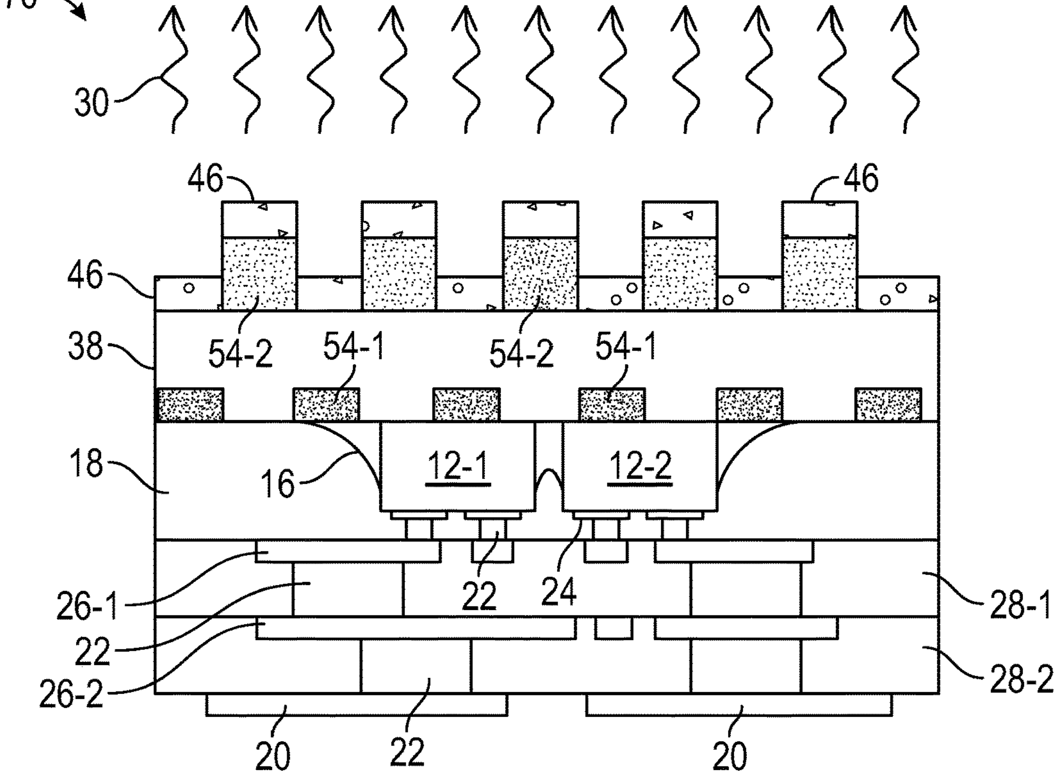
FIG. 14 is a cross-sectional view of an LED device that is similar to the LED device of FIG. 12 for embodiments where the pattern of the first light-altering layer is inverse to the pattern of the second light-altering layer.

FIG. 14 is a cross-sectional view of an LED device 70 that is similar to the LED device 66 of FIG. 12 for embodiments where the pattern of the first light-altering layer 54-1 is inverse to the pattern of the second light-altering layer 54-2. As illustrated, the inverse patterns provide an arrangement where segments of the first light-altering layer 54-1 are vertically aligned with openings of the second light-altering layer 54-2. In this manner, variations in amounts of light passing through each of the first and second light-altering layers 54-1, 54-2 may be offset to improve overall emission uniformity. As described above, the pattern of the light-absorbing layer 46 may be the same as or inverse to the second light-altering layer 54-2.

Figures 15, 16, 17:
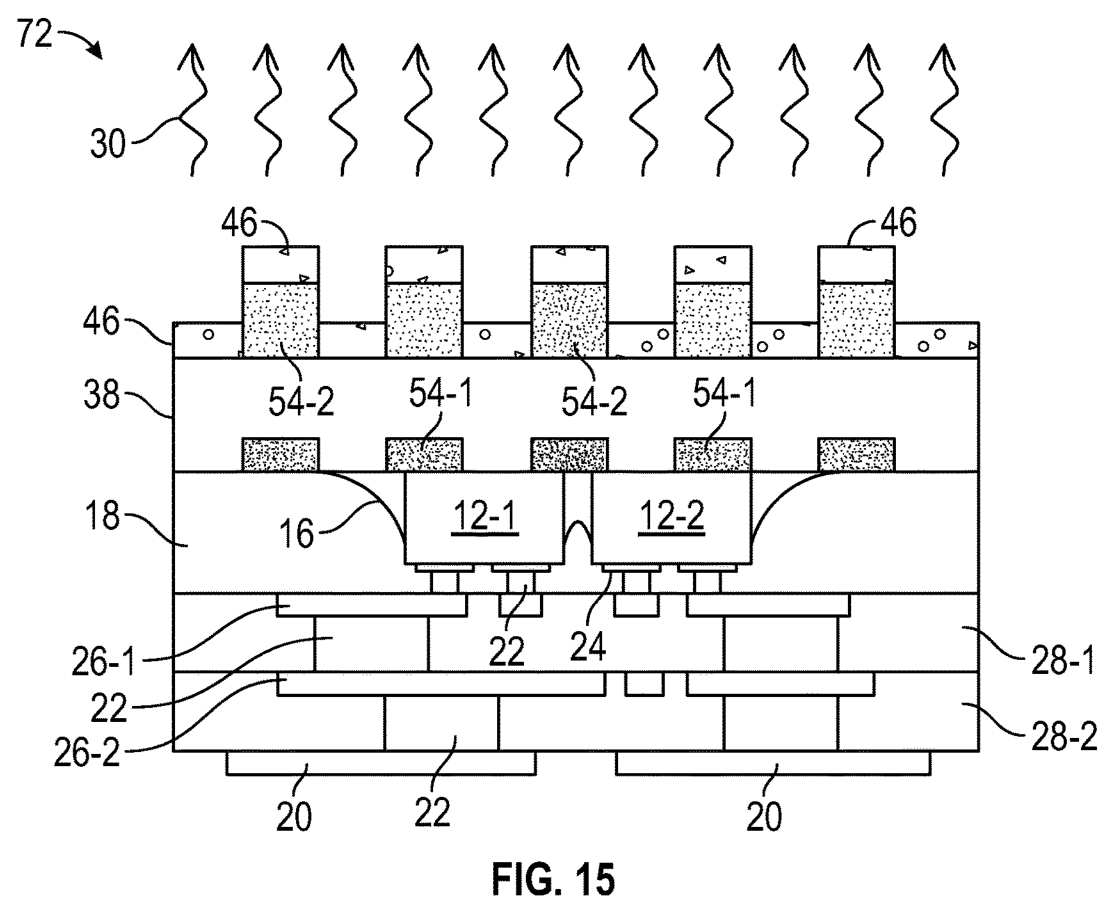
FIG. 15 is a cross-sectional view of an LED device that is similar to the LED device of FIG. 14 for embodiments where the pattern of the first light-altering layer is the same as the pattern of the second light-altering layer.
FIG. 16 illustrates a top view of an LED device for embodiments where the second light-altering layer is arranged in a checkerboard pattern across the LED device.
FIG. 17 is a top view of an LED device that is similar to the LED device of FIG. 16 for embodiments where segments of the second light-altering layer vary in size along the LED device.

FIG. 15 is a cross-sectional view of an LED device 72 that is similar to the LED device 70 of FIG. 14 for embodiments where the pattern of the first light-altering layer 54-1 is the same as the pattern of the second light-altering layer 54-2. As illustrated, the same patterns provide an arrangement where segments of the first light-altering layer 54-1 are vertically aligned with the segments of the second light-altering layer 54-2. In this manner, openings in the first and second light-altering layers 54-1, 54-2 may be aligned to tailor increased light emissions along the LED device 72. As described above, the pattern of the light-absorbing layer 46 may be the same as or inverse to the second light-altering layer 54-2.

FIGS. 16 to 24 illustrate various patterns of the second light-altering layer 54-2 relative to LED chips 12-1 to 12-3 that may provide improved near-field and far-field emission uniformity according to aspects of the present disclosure. The first light-altering layer 54-1 may be omitted or provided in any of the arrangements illustrated in FIGS. 11A, 12, and 13. In further embodiments, the first light-altering layer 54-1 may be provided in an inverse pattern to the second light-altering layer 54-2 of FIGS. 18 to 24 in a similar manner as described above for FIG. 14. In other embodiments, the first light-altering layer 54-1 may be provided in same pattern as the second light-altering layer 54-2 of FIGS. 18 to 24 in a similar manner as described above for FIG. 15. The various patterns of the second light-altering layer 54-2 may include segments with various shapes, including squares, rectangles, triangles, circles, ovals, among other shapes, and combinations thereof. The various patterns may also be arranged as more randomized or noisy patterns, such as Gaussian noise distributions, particularly for smaller structure sizes to reduce light interference effects. The illustrations are conceptual and are not intended to indicate a relative size between the various patterns, LED chips 12-1 to 12-3, and overall LED devices. The pattern sizes could be anywhere from sub-micron to the size of the corresponding LED device, while the LED chips 12-1 to 12-3 are generally many micrometers such as more than 100 μm. In each of FIGS. 16 to 24, footprints of the LED chips 12-1 to 12-3 are indicated by superimposed dashed line boxes.

FIG. 16 illustrates a top view of an LED device 74 for embodiments where the second light-altering layer 54-2 is arranged in a checkerboard pattern across the LED device 74. As such, openings of the second light-altering layer 54-2 are evenly distributed across the LED device 74 for improved uniformity. In certain embodiments, the checkerboard nature of the pattern may provide connecting corners of the segments of the second light-altering layer 54-2.

FIG. 17 is a top view of an LED device 76 that is similar to the LED device 74 of FIG. 16 for embodiments where segments of the second light-altering layer 54-2 vary in size along the LED device 76. For example, the pattern of segments of the second light-altering layer 54-2 may alternate between smaller surface area and larger surface area segments across the LED device 76. Notably, only the smaller surface area segments may be arranged closest to the perimeter edges of the LED device 76 where light emissions may be reduced in conventional devices.

FIG. 18 is a top view of an LED device 78 that is similar to the LED device 74 of FIG. 16 for embodiments where segments of the second light-altering layer 54-2 are discontinuously formed across the LED device 78. In this manner, increased surface area of the LED device 78 that is devoid of the second light-altering layer 54-2 is provided relative to FIG. 16. Such an arrangement may be beneficial, depending on brightness levels of the LED chips 12-1 to 12-3, for reducing any appearance of the pattern of the second light-altering layer 54-2. In other embodiments, the pattern illustrated for the second light-altering layer 54-2 may be inverted such that the shaded squares represent holes or openings of the second light-altering layer 54-2.

FIG. 19 is a top view of an LED device 80 that is similar to the LED device 74 of FIG. 16 for embodiments where shapes and/or sizes of the segments of the second light-altering layer 54-2 vary across the LED device 80. For example, a larger rectangular segment of the second light-altering layer 54-2 may be arranged to cover an area of the LED chips 12-1 to 12-3, thereby masking their appearance and reducing higher direct emission intensities at a center of the LED device 80. Additionally, other segments of the second light-altering layer 54-2 are arranged about a periphery of the larger rectangular segment. Such additional segments may be arranged with circular or otherwise rounded shapes that reduce instances of sharp corners of the second light-altering layer 54-2 for improved emission uniformity. In other embodiments, the pattern of circles illustrated for the second light-altering layer 54-2 may be inverted such that the shaded circles represent holes or openings of the second light-altering layer 54-2. In still further embodiments, many other patterns of the second light-altering layer 54-2 are contemplated that would also serve a similar purpose. For example, the central rectangle of the second light-altering layer 54-2 that is registered with the LED chips 12-1 to 12-3 may be replaced with a checkerboard pattern such that portions thereof have small openings therethrough.

FIG. 20 is a top view of an LED device 82 that is similar to the LED device 80 of FIG. 19 for embodiments where a density of the segments of the second light-altering layer 54-2 vary across the LED device 82. For example, a higher density of segments of the second light-altering layer 54-2 may be provided in an area corresponding to the LED chips 12-1 to 12-3, thereby at least partially masking their appearance and reducing higher emission intensities at a center of the LED device 82. In other embodiments, the pattern of circles illustrated for the second light-altering layer 54-2 may be inverted such that the shaded circles represent holes or openings of the second light-altering layer 54-2.

FIG. 21 is a top view of an LED device 84 that is similar to the LED device 74 of FIG. 16 for embodiments where the pattern includes a single segment of the second light-altering layer 54-2 that is registered with the LED chips 12-1 to 12-3. As illustrated, the segment of the second light-altering layer 54-2 may cover larger portions of the LED device 84 that are centrally located and typically associated with bright emission spots in conventional devices. In this regard, the second light-altering layer 54-2 may allow reduced central emissions while redirecting other emissions laterally to escape near peripheral edges of the LED device 84.

FIG. 22 is a top view of an LED device 86 that is similar to the LED device 84 of FIG. 21 where the single segment of the second light-altering layer 54-2 is provided in a band that traverses between two opposing peripheral edges of the LED device 84. In certain embodiments, the single segment of the second light-altering layer 54-2 may traverse entirely between the two opposing peripheral edges.

FIG. 23 is a top view of an LED device 88 that is similar to the LED device 86 of FIG. 22 where the single segment of the second light-altering layer 54-2 is provided with a surface area that corresponds with a combined surface area or footprint of the LED chips 12-1 to 12-3. In this regard, the second light-altering layer 54-2 may mask the appearance of the LED chips 12-1 to 12-3 and/or reduce emission intensities at central portions of the LED device 88 without occupying large areas of the LED device 88.

FIG. 24 is a top view of an LED device 90 that is similar to the LED device 88 of FIG. 22 except the second light-altering layer 54-2 forms a pattern with individual segments, each of which are registered with or otherwise matched with footprints of corresponding individual ones of the LED chips 12-1 to 12-3. As with FIG. 23, such an arrangement may mask the appearance of the LED chips 12-1 to 12-3 and/or reduce emission intensities at central portions of the LED device 90 without occupying large areas of the LED device 90.

It is understood that the above-described patterns of the second light-altering layer 54-2 may be at or near 0% transmission, thus effectively blocking and redirecting all incoming light, or of any intermediate % transmission where a certain amount of light is redirected and other portions of light are allowed to pass through. Additionally, boundaries or pattern edges of the second light-altering layer 54-2 may be graded from one transmission amount or tone to another, thereby having so-called "soft" edges.

Figures 25A, 25B:
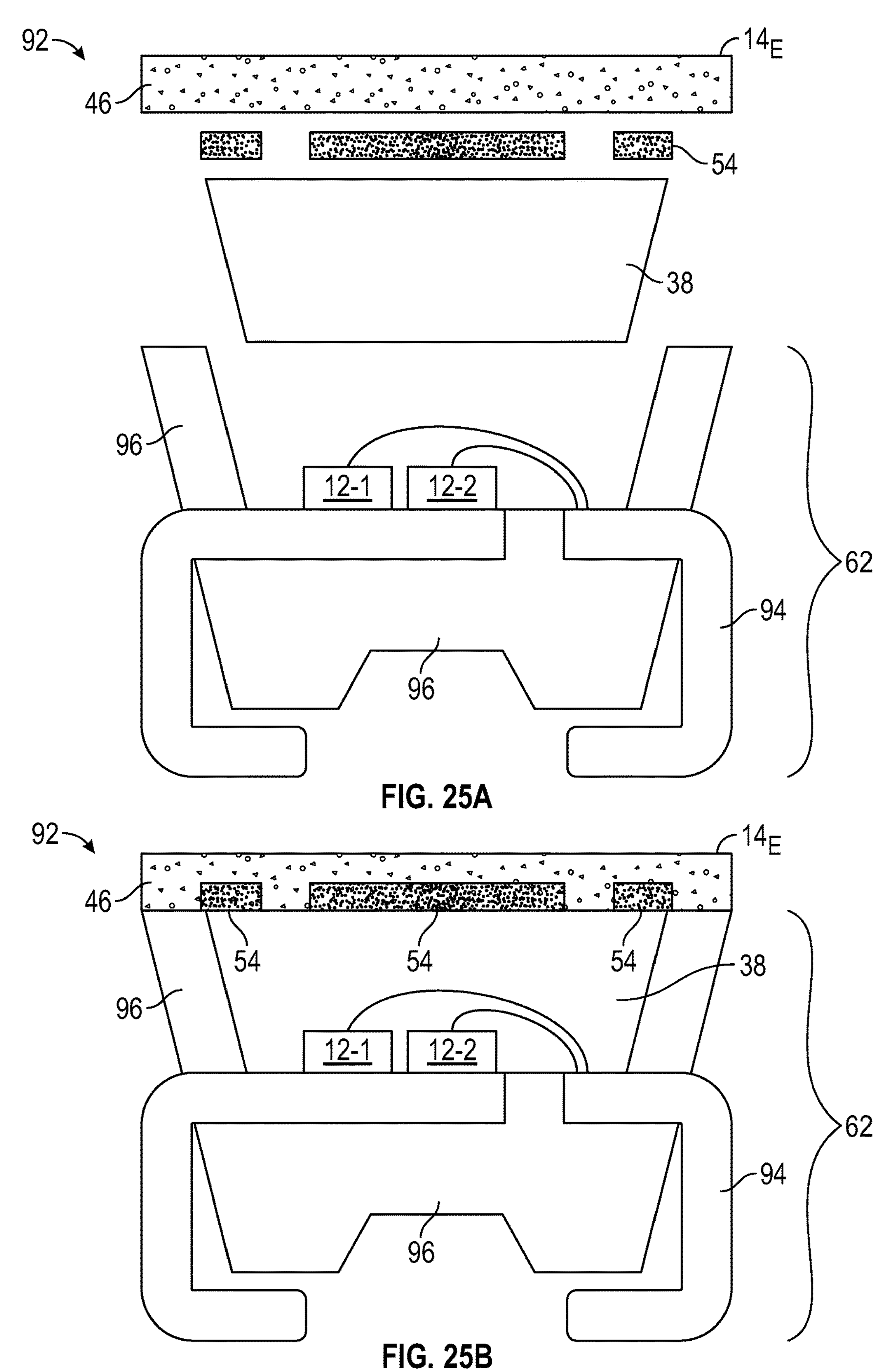
FIG. 25A is an exploded cross-sectional view of a general LED device that is similar to the LED device of FIG. 10 for embodiments where the base structure is a lead frame structure.
FIG. 25B is an assembled cross-sectional view of the LED device of FIG. 25A.

As described above, base structures 62 for any of the previously described embodiments of FIGS. 10 to 24 may embody various structures, such as insulating submounts with electrically conductive traces or lead frame structures including PLCC LED packages. FIG. 25A is an exploded cross-sectional view of a general LED device 92 that is similar to the LED device 60 of FIG. 10 for embodiments where the base structure 62 is a lead frame structure. In this regard, the base structure 62 includes a lead frame 94 and a corresponding housing 96. The lead frame 94 provides electrical connections to the LED chips 12-1 to 12-2, and in some instances, the LED chips 12-1 to 12-2 are mounted on a portion of the lead frame 94 and wirebonded to another portion of the lead frame 94. For illustrative purposes, wirebonds are generally drawn in FIG. 25A as curved lines connecting the LED chips 12-1 to 12-2 to a portion of the lead frame 94. It is understood that other arrangements of wirebonds may also be implemented. In other arrangements, one or more of the LED chips 12-1 to 12-2 may be flip-chip mounted to the lead frame 94 without the need for wirebonds. The housing 96 may include a recess with sidewalls in which the LED chips 12-1 to 12-2 reside. In certain embodiments, the sidewalls of the housing 96 may be beveled. The light-transparent layer 38 may be shaped to fit within the recess of the housing 96, or the light-transparent layer 38 may be formed within the recess to conform to the shape thereof. The light-altering layer 54 and optional light-absorbing layer 46 may be provided as described above. One or more portions of one or more of the light-altering layer 54 and the light-absorbing layer 46 may generally conform to the shape of the light-transparent layer 38, which could be flat, convex, concave, or in the shape of a lens. FIG. 25B is an assembled cross-sectional view of the LED package 92 of FIG. 25A.

In certain aspects, light-altering layers of the present disclosure may embody anodized metal layers, such as anodized aluminum. Anodizing is an electrochemical process that forms a metal oxide layer at metal surfaces. In the case of aluminum, anodizing forms an aluminum oxide layer or film at surfaces of the bulk aluminum. In certain aspects, the aluminum oxide layer of anodized aluminum may be formed with a porous structure. When the anodized aluminum is thin enough, the porous structure may allow light to pass therethrough. Other portions of the porous structure may be filled with a pigment and subsequently sealed to provide other optical properties for an LED device. For example, a black pigment or hue may be provided in certain areas to provide localized light-absorbing characteristics as described above.

Figure 26A:
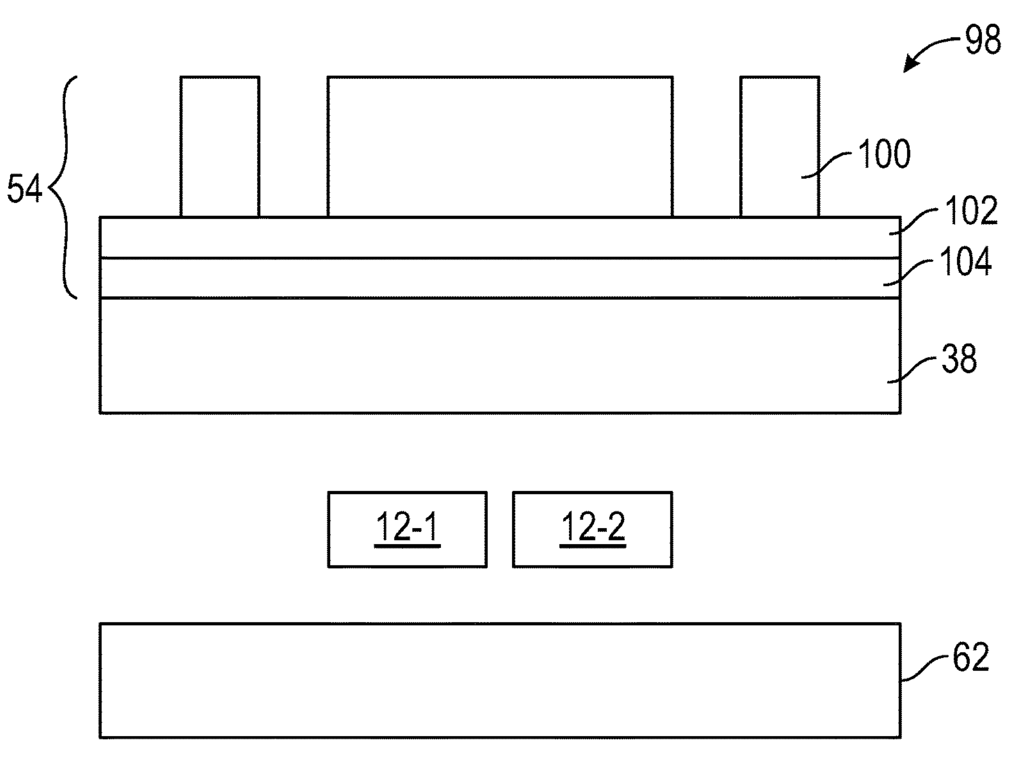
FIG. 26A is a partially exploded cross-sectional view of a general LED device that is similar to the LED device of FIG. 10 for embodiments where the light-altering layer includes an anodized metal structure and FIG. 26A represents a fabrication step before anodization.
Figure 26B:
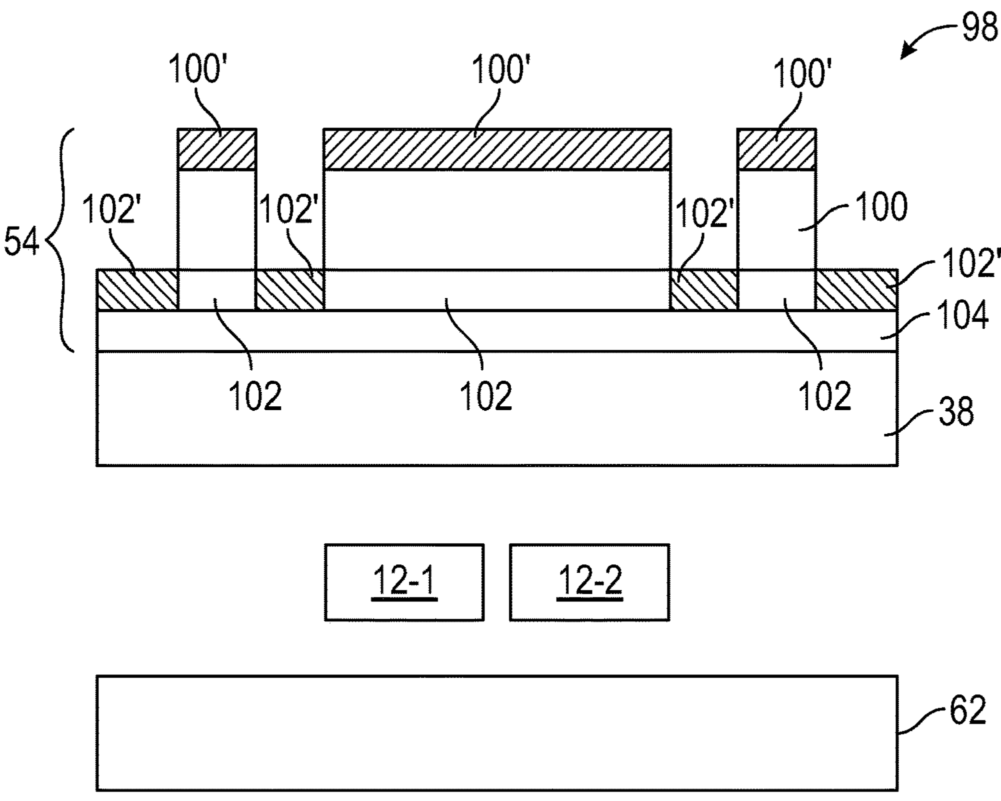
FIG. 26B is a partially exploded cross-sectional view of the LED device of FIG. 26A after anodization.

FIGS. 26A and 26B are partially exploded cross-sectional views of a general LED device 98 that is similar to the LED device 60 of FIG. 10 for embodiments where the light-altering layer 54 includes an anodized metal structure, such as anodized aluminum. FIG. 26A represents the light-altering layer 54 before it is anodized and FIG. 26B represents the light-altering layer 54 after anodizing. The LED device 98 may include the LED chips 12-1 to 12-2, the light-transparent layer 38, and the base structure 62 as previously described. The light-altering layer 54 may include a patterned metal layer 100 that is provided in a similar manner to any of the patterns of the light-altering layer 54 illustrated in previous embodiments. As illustrated in FIG. 26B, top portions of the patterned metal layer 100 may form a metal oxide 100' after anodization. Additionally, sidewall surfaces of the patterned metal layer 100 may have anodized surfaces. As illustrated, the patterned metal layer that is an anodized metal layer may be formed with localized regions with different thicknesses from one another. In certain embodiments, the metal oxide 100' may be dyed with a light-absorbing pigment or color, such as a black pigment, to provide various emission tailoring characteristics, such as a top matte finish for improved contrast. Bottom portions of the patterned metal layer 100 have portions of metal that are not oxidized and may therefore provide increased light-reflectivity for light passing through the light-transparent layer 38.

As illustrated in FIG. 26A, the light-altering layer 54 may further include a number of optional layers that assist with the anodizing process. For example, an additional metal layer 102 and/or a current spreading layer 104 may be formed between the patterned metal layer 100 and the light-transparent layer 38 to provide current flow to various areas as needed for the anodizing process. The current spreading layer 104 may be electrically conductive and at least partially light-transmissive to light from the LED chips 12-1 to 12-2. As illustrated in FIG. 26B, the additional metal layer 102 may also be anodized to form a metal oxide 102' during the anodizing process. When sufficiently thin, the porosity of the metal oxide 102' may provide light paths for the light to travel between the patterned metal layer 100. In certain embodiments, both the patterned metal layer 100 and the additional metal layer 102 comprise aluminum. The current spreading layer 104 may comprise indium tin oxide, among others, that may promote full anodization of the additional metal layer 102 by maintaining electrical conductivity. In this manner, the metal oxide 102' of the additional metal layer 102 may form with increased porosity such that the metal oxide 102' is light-transmissive or even light-transparent.

In other embodiments, the additional metal layer 102 and/or the current spreading layer 104 may be omitted. In such embodiments, the patterned metal layer 100 with the metal oxide 100' may be formed by blanket metal deposition such as evaporation or sputtering, followed by anodization, and then the anodized structure may be additionally patterned. In either case, with or without the additional metal layer 102 and/or the current spreading layer 104, the anodizing process and/or the thickness of the patterned metal layers 100 may be tailored to adjust optical properties of the light-altering layer 54.

While FIGS. 26A and 26B are provided in the context of the light-altering layer 54 being provided on a side of the light-transparent layer 38 that is farther from the LED chips 12-1 to 12-2, it is contemplated that anodized metal layers may also be provided on the side of the light-transparent layer 38 that is closest to the LED chips 12-1 to 12-2. For example, one or more of the light-altering layers 54-1, 54-2 as illustrated for FIG. 12 may embody anodized metal layers.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) device comprising:
one or more LED chips;
a light-transparent layer on the one or more LED chips; and
a light-altering layer that is arranged in a pattern on the light-transparent layer such that the light-transparent layer is between the light-altering layer and the one or more LED chips, wherein the pattern comprises individual features with a size in a range from 10 nanometers (nm) to 900 nm.

2. The LED device of claim 1, wherein the light-altering layer comprises one or more of a light-diffusing layer, a light-scattering layer, and a light-reflective layer.

3. The LED device of claim 2, wherein the light-altering layer comprises the light-diffusing layer, and wherein the light-diffusing layer comprises light-diffusing particles dispersed within a light-transparent material or a textured surface.

4. The LED device of claim 2, wherein the light-altering layer comprises the light-reflecting layer, and wherein the light-reflecting layer has a thickness that is less than or equal to 100 nanometers (nm).

5. The LED device of claim 2, further comprising a light-absorbing layer on the light-altering layer and on portions of the light-transparent layer that are between portions of the light-altering layer.

6. The LED device of claim 1, wherein the pattern comprises discontinuous segments of the light-altering layer.

7. The LED device of claim 1, wherein the pattern comprises connected segments of the light-altering layer.

8. The LED device of claim 1, wherein the pattern comprises a segment of the light-altering layer that is registered with the one or more LED chips.

9. The LED device of claim 1, wherein the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 750 nm.

10. The LED device of claim 1, further comprising a base structure on which the one or more LED chips are mounted, wherein the base structure comprises an insulating submount with electrically conductive traces or a lead frame structure.

11. The LED device of claim 1, wherein the pattern is a molded pattern or an embossed pattern.

12. A light-emitting diode (LED) device comprising:
- one or more LED chips;
- a light-transparent layer on the one or more LED chips; and
- a light-altering layer that is arranged in a pattern on the light-transparent layer such that the light-transparent layer is between the light-altering layer and the one or more LED chips, wherein the light-altering layer comprises at least one anodized metal layer.

13. The LED device of claim 12, further comprising a current spreading layer between the at least one anodized metal layer and the one or more LED chips.

14. The LED device of claim 12, wherein the at least one anodized metal layer comprises a pigment that is light-absorbing.

15. The LED device of claim 12, wherein the at least one anodized metal layer comprises localized regions with different thicknesses from one another.

16. A light-emitting diode (LED) device comprising:
- one or more LED chips;
- a first light-altering layer on the one or more LED chips;
- a second light-altering layer on the first light-altering layer such that the first light-altering layer is closer to the one or more LED chips than the second light-altering layer; and
- a light-transparent layer between the first light-altering layer and the second light-altering layer, and at least one of the first light-altering layer and the second light-altering layer is arranged in a pattern on the light-transparent layer, wherein the pattern comprises individual features with a size in a range from 10 nanometers (nm) to 900 nm.

17. The LED device of claim 16, wherein the first light-altering layer and the second light-altering layer each comprise a light-diffusing layer or a light-reflective layer.

18. The LED device of claim 16, wherein the pattern comprises one or more segments of the second light-altering layer.

19. The LED device of claim 18, wherein the first light-altering layer is arranged in an additional pattern that comprises one or more segments of the first light-altering layer.

20. The LED device of claim 19, wherein the one or more segments of the first light-altering layer are laterally spaced from the one or more LED chips to form an opening in the first light-altering layer that is registered with the one or more LED chips.

21. The LED device of claim 19, wherein the one or more segments of the first light-altering layer are arranged between the one or more LED chips and the light-transmissive layer such that the one or more segments of the first light-altering layer are registered with the one or more LED chips.

22. The LED device of claim 19, wherein the one or more segments of the first light-altering layer are arranged in an inverse pattern to the one or more segments of the second light-altering layer.

23. The LED device of claim 19, wherein the one or more segments of the first light-altering layer are arranged in a same pattern as the one or more segments of the second light-altering layer.

24. The LED device of claim 18, wherein the one or more segments of the second light-altering layer form a checkerboard pattern.

25. The LED device of claim 18, wherein the one or more segments of the second light-altering layer comprise alternating segments that vary in surface area or shape.

26. The LED device of claim 18, wherein the one or more segments of the second light-altering layer comprise a first segment arranged over the one or more LED chips and a plurality of second segments that are arranged about a periphery of the first segment.

27. The LED device of claim 18, wherein the one or more segments of the second light-altering layer comprise a plurality of segments that vary in density across the LED device.

28. The LED device of claim 16, wherein at least one of the first light-altering layer and the second light-altering layer comprises an anodized metal layer.

* * * * *